United States Patent
Kato et al.

(10) Patent No.: US 7,247,074 B2
(45) Date of Patent: Jul. 24, 2007

(54) ORGANIC ELECTROLUMINESCENT ELEMENT AND PROCESS FOR ITS MANUFACTURE

(75) Inventors: Tetsuya Kato, Anjo (JP); Kojiro Tachi, Nagoya (JP); Masaaki Ozaki, Kariya (JP)

(73) Assignee: DENSO Corporation, Kariya (JP)

( * ) Notice: Subject to any disclaimer, the term of this patent is extended or adjusted under 35 U.S.C. 154(b) by 0 days.

(21) Appl. No.: 11/405,414

(22) Filed: Apr. 18, 2006

(65) Prior Publication Data
US 2006/0186798 A1 Aug. 24, 2006

Related U.S. Application Data

(62) Division of application No. 10/306,170, filed on Dec. 2, 2002, now abandoned.

(30) Foreign Application Priority Data

Dec. 3, 2001 (JP) .............................. 2001-369031
Dec. 3, 2001 (JP) .............................. 2001-369032
Sep. 12, 2002 (JP) .............................. 2002-266943

(51) Int. Cl.
*H01J 9/00* (2006.01)
*H01J 9/24* (2006.01)

(52) U.S. Cl. .................. 445/24; 445/25; 313/504; 313/506

(58) Field of Classification Search ............... 445/24, 445/25; 427/66; 313/502–504, 506
See application file for complete search history.

(56) References Cited

U.S. PATENT DOCUMENTS

| | | | |
|---|---|---|---|
| 5,059,862 A | 10/1991 | VanSlyke et al. ............ 313/503 |
| 5,306,572 A | 4/1994 | Ohashi et al. ............... 428/690 |
| 5,405,709 A | 4/1995 | Littman et al. ............. 428/690 |
| 5,409,783 A | 4/1995 | Tang et al. ................. 428/690 |
| 5,652,067 A | 7/1997 | Ito et al. .................... 428/690 |
| 6,023,073 A | 2/2000 | Strite ......................... 257/40 |
| 6,060,826 A | 5/2000 | Ueda et al. |
| 6,268,072 B1 | 7/2001 | Zheng et al. ............... 428/690 |
| 6,284,393 B1 | 9/2001 | Hosokawa et al. ........ 428/690 |

FOREIGN PATENT DOCUMENTS

GB  2352327  1/2001

(Continued)

OTHER PUBLICATIONS

Office Action issued from Japanese Patent Office mailed on Aug. 1, 2006 for the corresponding Japanese patent application No. 2001-369031 (a copy and English translation thereof).

*Primary Examiner*—Mariceli Santiago
*Assistant Examiner*—Kevin Quarterman
(74) *Attorney, Agent, or Firm*—Posz Law Group, PLC

(57) ABSTRACT

An organic EL element is formed having a crystalline CuPc film as a positive hole injection layer and a positive hole transport layer, a luminescent layer, an electron transport layer and an electron injection layer, composed of amorphous organic materials, laminated between a pair of electrodes, wherein the change in the diffraction peak value of the CuPc film appearing with X-ray diffraction, which is produced by heating in the utilization temperature range of the organic EL element, is within ±25% of the diffraction peak value before heating. The organic EL element comprising a crystalline organic material is resistant to current shorts and leaks and exhibits satisfactory luminance properties in the utilization temperature range.

18 Claims, 12 Drawing Sheets

FOREIGN PATENT DOCUMENTS

| | | |
|---|---|---|
| JP | A-2-12795 | 1/1990 |
| JP | A-3-173095 | 7/1991 |
| JP | 04129191 A * | 4/1992 |
| JP | 04334895 A * | 11/1992 |
| JP | A-5-182764 | 7/1993 |
| JP | A-7-201467 | 8/1995 |
| JP | A-10-41070 | 2/1998 |
| JP | A-10-261484 | 9/1998 |
| JP | A-10-270167 | 10/1998 |
| JP | 2000077183 A * | 3/2000 |
| JP | A-2000-150147 | 5/2000 |
| JP | 2000223264 A * | 8/2000 |
| JP | A-2000-340367 | 12/2000 |
| JP | A-2001-160491 | 6/2001 |
| JP | A-2002-216969 | 8/2002 |

* cited by examiner

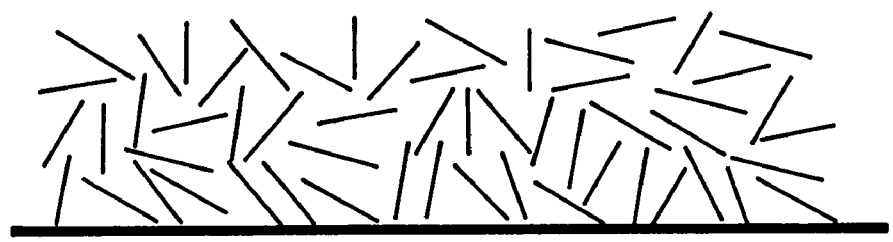
Fig.1A
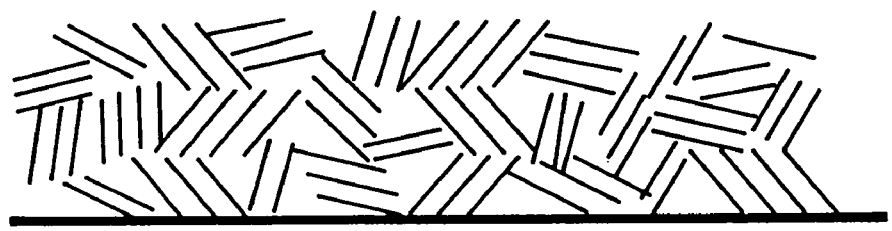
Fig.1B
Fig. 2
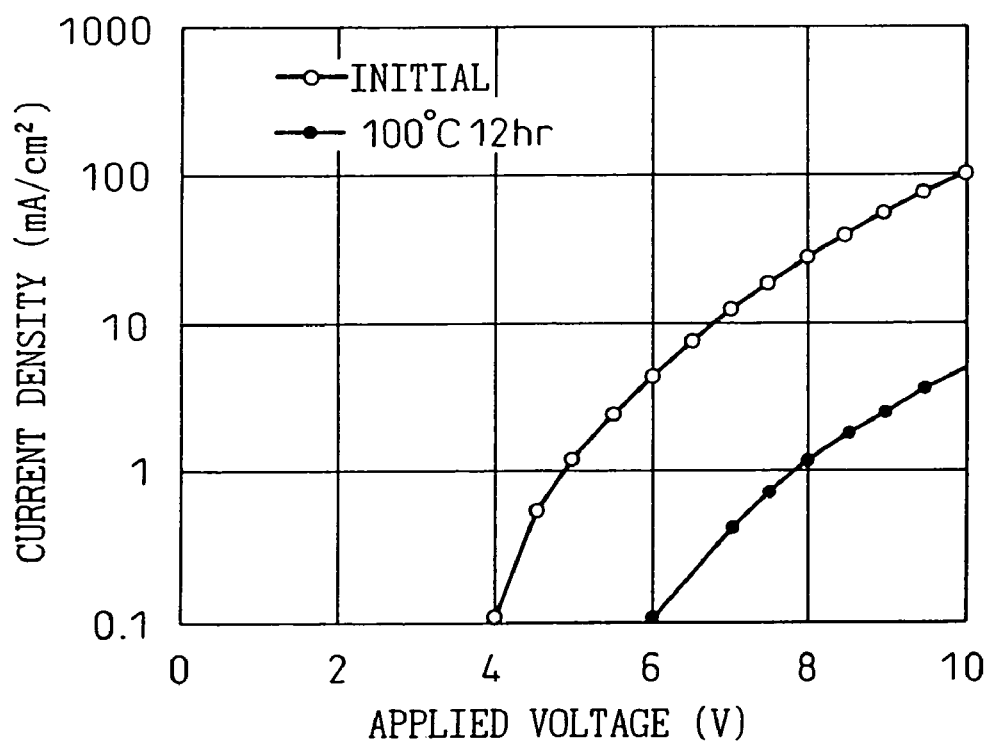

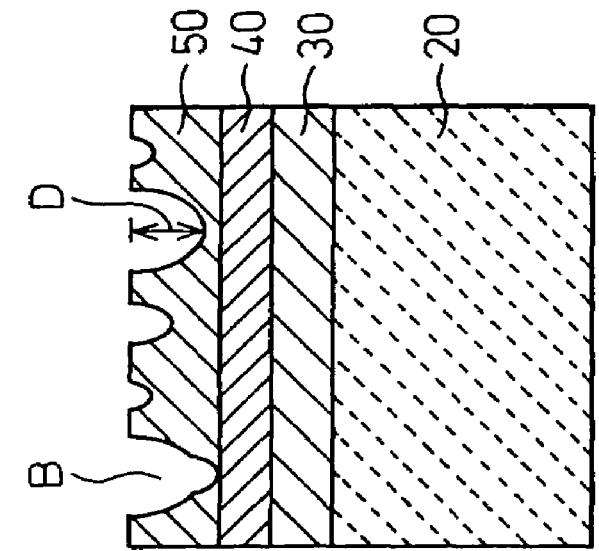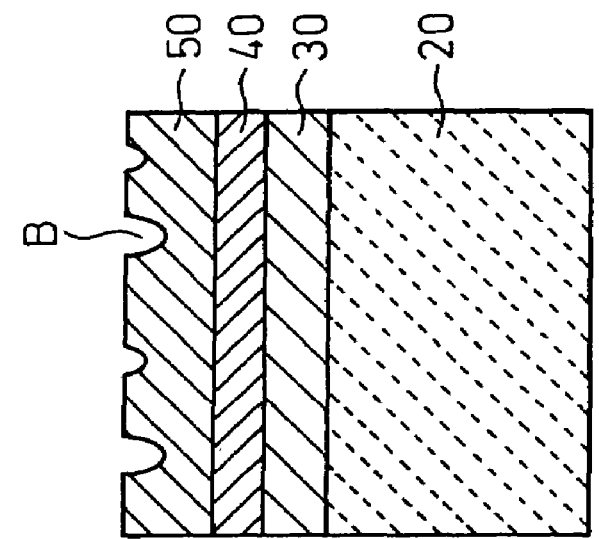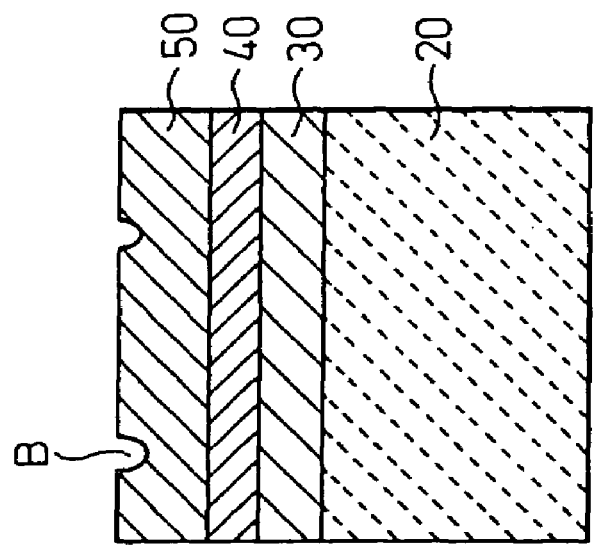

Fig.14

| JUDGEMENT | V-I SHIFT | X-RAY DIFFRACTION PEAK RATIO | CuPc FILM THICKNESS | ITO FILM CLEANING PRETREATMENT | CuPc FILM HEATING TEMPERATURE | CuPc FILM DEPOSITION METHOD |
|---|---|---|---|---|---|---|
| ◎ | 0V | 1.02 | 10nm | UV300℃ | 420℃ | |
| ◎ | 1.0V | 1.15 | 10nm | PLASMA | 520℃ | |
| ◎ | 1.0V | 1.13 | 10nm | PLASMA | 420℃ | HEATING AFTER DEPOSITION (150℃ UNDER VACUUM) |
| ◎ | 1.0V | 1.15 | 10nm | PLASMA | 420℃ | HEATING AFTER DEPOSITION (100℃ UNDER VACUUM) |
| ◎ | 1.2V | 1.21 | 10nm | UV150℃ | 520℃ | |
| ○ | 1.5V | 1.21 | 10nm | UV ROOM TEMPERATE | 520℃ | |
| ○ | 1.6V | 1.22 | 10nm | UV250℃ | 420℃ | |
| ○ | 1.6V | 1.25 | 10nm | PLASMA | 420℃ | HEATING AFTER DEPOSITION (70℃ UNDER VACUUM) |
| × | 2.0V | 1.31 | 10nm | UV150℃ | 420℃ | |
| × | 2.8V | 0.68 | 50nm | PLASMA | 420℃ | |
| × | 3.0V | 1.47 | 10nm | PLASMA | 420℃ | |

◎: VERY EXCELLENT, ○: EXCELLENT, ×: BAD

ORGANIC ELECTROLUMINESCENT ELEMENT AND PROCESS FOR ITS MANUFACTURE

CROSS REFERENCE TO RELATED APPLICATIONS

This application is a division of application Ser. No. 10/306,170 filed on Dec. 2, 2002, now abandoned, which is based on Japanese Patent Application Nos. 2001-36903 1 filed on Dec. 3, 2001, 2001-369032 filed on Dec. 3, 2001, and 2002-266943 filed on Sep. 12, 2002, the disclosures of which are incorporated herein by reference.

BACKGROUND OF THE INVENTION

1. Field of the Invention

The present invention relates to an organic electroluminescent (organic EL) element having an organic material as the luminescent material, and to a process for its manufacture. The invention is particularly suitable for vehicle displays and the like which are exposed to high-temperature environments.

2. Description of the Related Art

Organic EL elements exhibit excellent visibility due to their self-luminescent nature, and allow weight reduction of driving circuits as well because of their low driving voltage of from a few volts to a few dozen volts. They therefore show promise for applications as thin-film displays, lightings and backlights. Organic EL elements are also characterized by abundant color variations.

The basic structure of an organic EL element has a laminate of a plurality of organic thin-films formed on an electrode formed on a substrate, with an electrode formed over the organic thin-film laminate. The major types of materials used for the organic thin-films are low molecular types applied by vacuum vapor deposition and high molecular types applied by coating of solutions onto substrates.

The major types of low molecular materials used are non-crystalline amorphous materials for formation of films by vacuum vapor deposition. These materials exhibit no diffraction peak with analysis by X-ray diffraction.

However, amorphous organic thin-films undergo crystallization when their glass transition temperature (hereinafter referred to as "Tg point") is exceeded due to temperature variation, resulting in inconveniences such as unevenness of the film producing shorter distances between electrodes, causing current shorts or leaks, and creating electric field condensing.

Techniques aimed at achieving a longer working life for such low molecular organic thin-film materials by means of a crystalline structure are disclosed in Japanese Unexamined Patent Publication HEI No. 3-173095 and Japanese Unexamined Patent Publication HEI No. 5-182764.

The former publication describes the feature of a positive hole transport layer and a luminescent layer in an organic compound thin-film with a crystalline structure, and the examples therein include using N,N'-diphenyl-N,N'-di(3-methylphenyl)-1,1'-biphenyl-4,4'-diamine (hereinafter referred to as TPD) as the positive hole transport layer and an aluminum complex of 8-hydroxyquinoline (hereinafter referred to as Alq3) as the luminescent layer, and employing a substrate temperature of 50° C. during film formation to form a crystalline organic thin-film.

The latter publication describes using the same materials mentioned above, TPD and Alq3, for the positive hole transport layer and luminescent layer, first forming the positive hole transport layer and then the luminescent layer, and immediately following this by heat treatment or performing heat treatment after formation of each layer, to create a fine crystalline aggregate structure of Alq3 as the luminescent layer.

However, when the present inventors used X-ray diffraction to analyze the crystalline states of simple films of TPD and Alq3 formed on ITO (transparent electrode)-formed glass substrates under the conditions described in each of the prior art documents mentioned above, no appearance of crystallinity-indicating diffraction peaks was found. That is, although the aforementioned prior art documents teach that the organic thin-films are crystalline, their crystallinity is such one which does not exhibit diffraction peaks in X-ray diffraction.

The present inventors explain these results as follows. This is illustrated in FIGS. 1A and 1B. FIG. 1A is a structure showing an amorphous state, and FIG. 1B is the presumed crystalline structure according to the aforementioned prior art documents.

Specifically, the lack of diffraction peaks in X-ray diffraction suggests that the crystalline structure described in the aforementioned prior art documents is not that of common crystals with a structure wherein the molecules are arranged in a regular parallel fashion on the substrate, but rather it is a structure with fine crystal aggregates or with fine crystals scattered throughout an amorphous thin-film.

Further examination by the present inventors revealed that, even though the organic compound film structures in these prior art documents are preformed as thin films with a fine crystalline aggregate structure to inhibit heat-induced alteration, formation of the fine crystalline aggregate structure reduces the luminescent efficiency by creating a smaller contact area and lower charge mobility between each of the layers, thereby resulting in reduced luminance or luminance irregularities, and producing new problems of electrode shorts and leaks due to the increased surface irregularities.

The luminance reduction is temperature-dependent, becoming more rapid with higher utilization temperature, while the luminance irregularities occur as light areas and dark areas are produced due to uneven luminance in the element.

According to a first aspect of the present invention, which has been accomplished in light of the new problems discovered by the present inventors, it is an object to realize an organic EL element comprising an organic material which is not amorphous and hence prone to changes in the film, but which has a crystallinity that includes fine crystals, the element being resistant to current shorts or leaks and exhibiting satisfactory luminance characteristics within the range of utilization temperature.

Of the materials used for organic thin-films of organic EL elements, the materials primarily used for low molecular materials, for film formation by vacuum vapor deposition, may be largely classified as either evaporating materials which gasify when in a liquid state, and sublimating materials which gasify when in a solid state.

Generally speaking, most tertiary amine compounds used for positive hole transport layers exhibit volatility, while 8-hydroxyquinoline aluminum complex used in luminescent layers and electron transport and injection layers are sublimating materials. That is, most organic EL elements have a structure comprising a combination of a evaporating material and a sublimating material.

Such organic EL elements exhibit notably reduced luminance at high temperatures and therefore are insufficiently durable as vehicle displays, which are used in higher temperature environments than most other commercial products.

Material manufacturers are therefore developing heat resistant materials, i.e. materials with high glass transition temperatures, and device manufacturers commonly employ methods of film formation using materials with higher glass transition temperatures than the temperatures to which the elements will be exposed. For example, Japanese Unexamined Patent Publication HEI No. 11-3782 teaches that when the environmental temperature exceeds the Tg of the constituent material, crystallization of the constituent material progresses leading to current leaks and shorts.

Experimental research by the present inventors, however, has confirmed that the problem of leaks or shorts is not solved even if the organic thin-film of the element is constructed with a material having a higher Tg than the temperatures to which the organic EL element will be exposed.

In light of these problems, therefore, it is an object according to a second aspect of the invention to provide an organic EL element having an organic thin-film including a luminescent layer between a pair of electrodes, which adequately prevents current leaks or shorts.

SUMMARY OF THE INVENTION

The present inventors have conducted much research aimed at achieving the aforementioned first aspect of the invention. The results have shown that the aforementioned luminance reduction, luminance irregularities, shorts and leaks are still produced even with an organic thin-film composed of an organic material possessing no glass transition temperature and having crystallinity which exhibits a diffraction peak in X-ray diffraction.

In other words, it was found that the cause of the above-mentioned luminance reduction, luminance irregularities, shorts and leaks can be traced to alterations in the crystalline state of the crystalline material, such as copper phthalocyanine (CuPc) which is often used for the positive hole injection layer. This cause will now be explained in detail based on data obtained from experiments conducted by the present inventors.

An anode ITO (transparent electrode) was formed on a glass substrate and surface treated with an argon and oxygen mixed plasma, after which a CuPc film was formed as the positive hole injection layer to a film thickness of 10 nm at a material heating temperature of 420° C., and then a triphenylamine tetramer as the positive hole transport layer, dimethyl quinacridone-containing Alq3 as the luminescent layer, Alq3 as the electron transport layer, LiF as the electron injection layer and Al as the cathode were formed in that order, to fabricate an organic EL element which was then sealed with a hermetic can. This fabricated sample will be referred to as the trial product. Of the organic thin-films, CuPc was crystalline while the other layers were amorphous.

FIG. 2 shows the voltage-luminance characteristic (V-I characteristic) of the trial product after standing at high temperature of 100° C. for 12 hours. As seen in FIG. 2, the V-I characteristic shifted toward the about +3V end after standing at high temperature, as compared to the initial characteristic before standing at high temperature.

This increases the burden on the driving circuit and leads to a higher circuit design cost. Also, since this occurs only partially in the element, regions of greater and lesser current flow are formed, being seen as luminance irregularities.

The material with the lowest Tg among the layers, or organic thin-films, of the trial product is the triphenylamine tetramer, at approximately 144° C. Since standing at 100° C. means standing in an environment of over 40° C. below the Tg point of this triphenylamine tetramer, the effect of progression of the fine crystal aggregate structure of the amorphous films other than CuPc is believed to be less with respect to this shift phenomenon.

Attention was therefore directed toward alteration in the crystalline state of the CuPc film (positive hole injection layer), which is an organic material with crystallinity. As a result, it was found that the crystalline state of the CuPc film differs notably before and after standing in a high temperature environment. The following are the results of examining the change in the crystalline state of the CuPc film.

For efficient confirmation of the crystalline state change, the evaluation was conducted with the standing environment temperature accelerated to as high as 120° C., with a standing time of 2 hours. Standing under these conditions will hereunder be referred to as accelerated high-temperature standing.

A CuPc film was formed on an ITO-formed glass substrate under the same conditions as the previous trial product which exhibited a shift of about 3V in the V-I characteristic as mentioned above. The state of crystallinity of the CuPc film in this case was analyzed by X-ray diffraction before and after the above-mentioned accelerated high-temperature standing, and the results are shown in FIG. 3.

As seen in FIG. 3, the diffraction peak occurring at $2\theta=6.68°$ is due to the crystal structure of CuPc. In FIG. 3, the solid line represents the peak before accelerated high-temperature standing, i.e. the initial peak, and the dotted line represents the peak after accelerated high-temperature standing, i.e. the peak after 120° C., 2 hours.

A larger integral value for a peak, i.e. a higher peak value, indicates greater crystallinity. Here, the accelerated high-temperature standing at 120° C. for 2 hours resulted in a peak value (integral value) which was 1.5 times compared to the peak value before accelerated high-temperature standing.

Thus, the present inventors surmised that since the change in the crystalline state occurs in the CuPc film after formation of the positive hole transport layer, luminescent layer, electron transport layer, cathode, etc. on the CuPc film as the positive hole injection layer, that is, after the luminescent element has been fabricated for this trial product, this is likely a major factor inducing changes in V-I characteristics in high temperature environments, thereby resulting in luminance reduction and luminance irregularities, as well as shorts and leaks.

This phenomenon is believed to likewise occur for materials other than low molecular materials, for example, high molecular materials such as PPV (polyphenylvinylene)-based materials, so long as they exhibit diffraction peaks in X-ray diffraction.

The present inventors devised the present invention upon considering that for an organic EL element comprising a crystalline organic material, the most effective means against alteration of the crystalline state of the organic material under high temperature environments is to form the film of the crystalline organic material so that it has as high a level of crystallinity as possible.

In other words, the first mode of the invention is an organic EL element comprising at least one crystalline organic material (that exhibits crystallinity), characterized in that among the values of the diffraction peaks appearing with X-ray diffraction of the crystalline organic material, the change in the diffraction peak value produced by heating in the utilization temperature range of the organic EL element is within ±25% of the diffraction peak value before heating. Here, the term "crystalline" also includes fine crystals.

If, among the values of the diffraction peaks appearing with X-ray diffraction of the crystalline organic material, the change in the diffraction peak value produced by heating in the utilization temperature range of the organic EL element is within ±25% of the diffraction peak value before heating as according to the invention, it is possible to limit the change in the crystalline state of the organic material to a level which does not result in luminance reduction or luminance irregularities, or shorts and leaks, even with use in high temperature environments.

According to the present invention, therefore, it is possible to prevent current shorts and leaks to produce satisfactory luminance characteristics in utilization temperature ranges of organic EL elements comprising crystalline organic materials.

When an ITO film composed of indium-tin oxide is formed on the substrate, the crystalline organic material may be constructed as an organic film formed on the ITO film.

The organic material exhibiting crystalline properties may be a copper phthalocyanine film, in which case the diffraction peak value is the diffraction peak value of the (200) face parallel to the substrate in the copper phthalocyanine film.

According to a third mode of the invention, there is provided a process for manufacture of an organic EL element wherein an ITO film composed of indium-tin oxide is formed on a substrate, and a crystalline organic material is formed as a film on the ITO film, characterized in that the bonded water on the surface of the ITO film is subjected to desorption treatment before forming the organic material film.

This can reduce adsorption water and bonded water on the surface of the ITO film underlying the crystalline organic material. The crystallinity of the organic material formed as a film on the ITO film with reduced bonded water can thereby be increased. It will thus be possible to limit the change in the crystalline state of the organic material to a level which does not result in luminance reduction or luminance irregularities, or shorts and leaks, even with use in high temperature environments.

According to the invention, therefore, it is possible to prevent current shorts and leaks to produce satisfactory luminance characteristics in utilization temperature ranges of organic EL elements comprising crystalline organic materials.

The desorption treatment is preferably carried out so that in the moisture-derived spectrum of the ITO film surface after desorption treatment, measured by thermal desorption, the bonded water peak value at near 330° C. is within 50% of the bonded water peak value of the ITO film surface before desorption treatment.

The desorption treatment is more preferably carried out so that in the moisture-derived spectrum of the ITO film surface after desorption treatment, measured by thermal desorption, the bonded water peak value at near 330° C. disappears.

The organic EL element according to the second mode of the invention is an organic EL element wherein an ITO film composed of indium-tin oxide is formed on a substrate, and a crystalline organic material is formed as a film on the ITO film, characterized in that the ITO film has no bonded water peak value at near 330° C. in the moisture-derived spectrum of the surface as measured by thermal desorption.

This makes it possible to prevent current shorts and leaks and produce satisfactory luminance characteristics in utilization temperature ranges of organic EL elements comprising crystalline organic materials.

According to the invention it is possible to form a film of a crystalline organic material directly on an ITO film. That is, it is possible to obtain a structure wherein a film of a crystalline organic material is in direct contact with the ITO film.

According to a fourth mode of the invention, there is provided a process for manufacture of an organic EL element wherein an ITO film composed of indium-tin oxide is formed on a substrate, and an organic material exhibiting crystalline properties is formed as a film on the ITO film, characterized in that the ITO film is heat treated at a temperature of 250° C. or higher before forming the organic material film.

This can reduce adsorption water and bonded water on the surface of the ITO film underlying the crystalline organic material, such that, similar to the third mode of the invention, the crystallinity of the organic material formed as a film on the ITO film with reduced bonded water can be increased.

According to the invention, therefore, it is possible to prevent current shorts and leaks and produce satisfactory luminance characteristics in utilization temperature ranges of organic EL elements comprising crystalline organic materials.

According to a fifth mode of the invention, there is provided a process for manufacture of an organic EL element wherein an ITO film composed of indium-tin oxide is formed on a substrate, and a crystalline organic material is formed as a film on the ITO film, characterized in that after the crystalline organic material is formed as a film on the ITO film, it is heat treated in a vacuum or in an inert gas atmosphere to complete film formation of the crystalline organic material.

By such heat treatment it is possible to increase the crystallinity of the film of the crystalline organic material which is formed on the ITO film. For example, the crystallinity increases up to a small level of change in the diffraction peak value of within ±25% of the diffraction peak value before heating, as described by the first mode of the invention.

It is thus possible to limit the change in the crystalline state of the organic material to a small level which does not result in luminance reduction or luminance irregularities, or shorts and leaks, even with use in high temperature environments. Therefore, according to this mode of the invention as well, it is possible to prevent current shorts and leaks and produce satisfactory luminance characteristics in utilization temperature ranges of organic EL elements comprising crystalline organic materials.

Investigation by the present inventors has demonstrated that it is preferred for the heat treatment temperature to be 70° C. or above, in order to more reliably exhibit the effect of the fifth mode of the invention for organic EL elements used in high temperature environments.

A film of a crystalline organic material can be formed directly on the ITO film in all of the aforementioned manufacturing processes. That is, the ITO film and the film of the crystalline organic material may be formed in direct contact with each other.

The following experimental investigation was conducted in order to achieve the object of the second aspect of the invention.

Specifically, an anode ITO film (transparent electrode) was formed on a glass substrate and surface treated with an argon and oxygen mixed plasma, after which a CuPc film was formed as the positive hole injection layer to a film thickness of 50 nm, and a triphenylamine tetramer as the positive hole transport layer, dimethyl quinacridone-containing Alq3 as the luminescent layer, Alq3 as the electron transport layer, LiF as the electron injection layer and Al as the cathode were formed in that order, to fabricate an organic EL element which was then sealed with a hermetic can. This will be referred to as the trial product.

The material with the lowest Tg among the constituent materials of the trial product is the triphenylamine tetramer, at 140° C. When the trial product was operated under various test temperature conditions, non-luminance due to shorts was confirmed in the element at 90° C. and above, while the non-luminance was accelerated in both number and period of generation as the temperature increased. That is, it was found that shorts and leaks are still generated even at a temperature of 50° C. below the Tg point 140° C. of the triphenylamine tetramer.

The results of the experiment indicated that the cause of shorts or leaks upon exposure to high temperature environments is not crystallization of the amorphous materials with a Tg, but rather they are due mainly to transformation of the organic thin-film composed of the sublimating material, i.e. the luminescent layer of the trial product, composed of the dimethyl quinacridone-added Alq3.

The experiment conducted to investigate this cause will now be explained in detail. To complete the experiment in a shorter time period, the trial product was allowed to stand for 2 hours at a temperature of 120° C. as an accelerated condition. This accelerated test will hereinafter be referred to as accelerated high-temperature standing. The voltage-luminance characteristic (V-I characteristic) of the trial product was examined before and after the accelerated high-temperature standing.

The results are shown in FIG. 4. In FIG. 4, the applied voltage is shown on the horizontal axis and the current density is shown on the vertical axis, with the value before accelerated high-temperature standing indicated as "initial" and the value after accelerated high-temperature standing indicated as "120° C., 2 hr".

FIG. 4 shows the normal V-I characteristic before accelerated high-temperature standing, whereby the current density increased as the applied voltage increased, with an applied voltage of 4V as the threshold voltage. After accelerated high-temperature standing, however, abnormalities were observed such as occurrence of leaks or shorts and a large current flow with an applied voltage below the threshold value.

For further examination of this phenomenon, the organic thin-film composed of the sublimating material, i.e. the Alq3 electron transport layer, of the trial product was observed. The results of observation by microscope are shown in FIGS. 5A to 5C, as schematic cross-sections of the microscope photographs.

In FIGS. 5A to 5C, there are successively laminated a CuPc film 30, a triphenylamine tetramer film 40 and an Alq3 film 50 made of Alq3 on an ITO film 20, with the state after standing at 85° C. shown in FIG. 5A, the state after standing at 100° C. shown in FIG. 5B and the state after standing at 120° C. shown in FIG. 5C. As seen in FIGS. 5A to 5C, more voids B are seen in the Alq3 surface with increasing standing temperature, suggesting a relationship between leaks and formation of voids B.

The sizes of the voids B are represented by the void depth D shown in FIG. 5C, and FIG. 6 shows a graph representing the temperature dependency of the void depth D. The sizes of the voids B are seen to have temperature dependency, and the threshold temperature for formation of voids B is estimated to be 70° C. by extrapolation.

This suggests that when the organic EL element is exposed to a high temperature environment of, for example, 70° C. or above, voids are produced in the surface of the organic thin-film composed of the sublimating material in the element, and irregularities are produced in the organic thin-film with these voids, thereby resulting in shorts and leaks between the electrodes.

Furthermore, since the voids occur in the Alq3 section, it is surmised that voids occur because the characteristics of the Alq3 sublimating material causes numerous gaps in the film, i.e. results in formation of a low density film, and we therefore concentrated on the difference in the film forming properties of sublimating materials and evaporating materials. Here, an evaporating material is a material which first melts to liquid when slowly heated and then converts from the liquid (melt) to a gas.

The difference in film formation between sublimating materials and evaporating materials will now be explained based on the experimental data obtained by the present inventors.

After treating the surface of ITO (transparent electrode) film formed on a glass substrate with an argon and oxygen mixed plasma, a CuPc film was formed to a film thickness of 50 nm, and then a triphenylamine tetramer film was formed to a thickness of 40 nm thereover as a positive hole transport layer.

Next, Alq3 was formed to a thickness of 40 nm as a luminescent layer of a sublimating material, on the positive hole transport layer. This will be referred to as the sublimating element. An adamantane derivative having the chemical structure shown below was also formed to a thickness of 40 nm on a separate positive hole transport layer, as a luminescent layer of a evaporating material. This will be referred to as the volatile element.

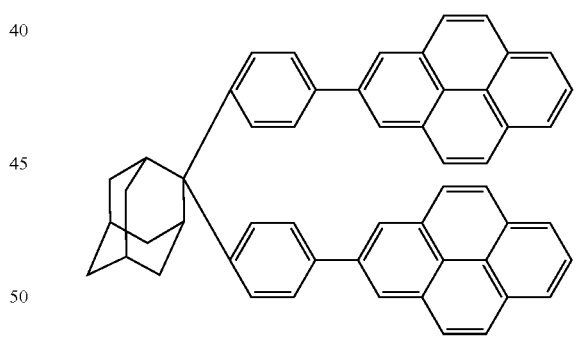

Also, the surface of the CuPc film on the ITO film and the surfaces of the luminescent layers on the sublimating element and the volatile element were observed by microscope. The results are shown in FIGS. 7A to 7C. FIG. 7A shows the surface of the CuPc film on the ITO film, FIG. 7B shows the surface of the luminescent layer of the evaporating material on the volatile element, and FIG. 7C shows the surface of the luminescent layer of the sublimating material on the sublimating element, in schematic form based on the microscope photographs.

As seen in FIGS. 7A to 7C, the irregularities of the underlying CuPc film were very clearly reflected with the luminescent layer composed of the volatile adamantine derivative material, but absolutely none of the irregularities of the underlying film were observed with the luminescent layer composed of the sublimating Alq3 material.

In other words, it is thought that since the evaporating material covers the underlying film in a manner which follows the irregularities, the shapes of the irregularities remain, whereas the sublimating material does not follow the irregularities of the underlying film and therefore the shape of the underlying film does not remain.

The reason for this is believed to be as follows the evaporating material melts and intermolecular interaction is severed, such that it attaches to the substrate as very small particles. On the other hand, the sublimating material does not undergo severing of the intermolecular interaction, and therefore attaches to the substrate as relatively large clusters. Consequently, the sublimating material forms voids in the film and tends to create low-density regions.

When an element having voids or low-density regions formed in the film is heated, densification proceeds due to the thermal activation energy. As a result, it is surmised, the transformation or void formation shown in FIG. 11 occurs, resulting in a shorter distance between electrodes at the sections of void formation in the film, such that the electric field condenses at the irregular sections of the film created by the voids, eventually producing leaks and shorts.

This phenomenon where the sublimating material film does not follow the irregularities of the underlying film is believed to occur in the same manner for particle or ITO film irregularities as well as for CuPc film irregularities. The problem definitely occurs during the manufacturing the steps in the case of particles.

The present inventors therefore devised the concept that in order to prevent leaks and shorts which occur when the element is exposed to high temperature, for an organic EL element having an organic thin-film comprising a luminescent layer between a pair of electrodes, it is necessary to form the organic thin-film using only a evaporating material and to form the film densely with a high degree of coverage. The present invention has been accomplished on the basis of this concept.

Thus according to a sixth mode of the invention, there is provided an organic EL element comprising organic thin-films including a luminescent layer between a pair of electrodes, characterized in that all of the organic materials composing the organic thin-films are volatile during formation of the films by vacuum vapor deposition.

According to the invention, all of the organic materials composing the organic thin-films are evaporating materials which are volatile during film formation by vacuum vapor deposition, and therefore the aforementioned generation of voids in high-temperature environments can be prevented to allow suitable prevention of current leaks and shorts.

As a result of further investigation, it was found that although current leaks and shorts are adequately prevented with accelerated high-temperature standing in the sixth mode of the invention, a phenomenon occurs whereby the voltage-current characteristic (V-I characteristic) of the element in a high-temperature environment such as with accelerated high-temperature standing shifts toward the high voltage end, as shown in FIG. 8. This is the same thing as reduced luminance with operation at the same voltage. This also sometimes occurs partially in the element, in which case luminance irregularities are perceived.

The cause of this shift phenomenon is believed to be as follows. The film of a sublimating material which has low density regions has a buffering property against thermal stress, i.e. the ability to readily absorb thermal stress, which is generated during heating, but a film composed of a evaporating material with a high density has a low buffering property and tends to transmit thermal stress.

Stated differently, the concept is that a sublimating material film is relatively soft and resistant to deformation under thermal stress, whereas a evaporating material film is relatively hard and tends to deform under thermal stress. It is therefore thought that the thermal stress is propagated to the entire element, producing deformation in all of the constituent films, thereby reducing positive hole and electron transport properties and injection properties, and resulting in the aforementioned shift phenomenon.

Even if all of the organic thin-films of the organic EL element are formed of evaporating materials, an amine-based material or the like is used as the evaporating material for the positive hole transport layer on the anode. This positive hole transport layer is usually highly amorphous such that no chemical bond is formed with the electrode composed of the underlying ITO film, and with the low cohesion between them, the interface between the ITO film and the positive hole transport layer peels due to the thermal stress. As a result, it is believed, it becomes difficult to inject a charge and the aforementioned shift phenomenon occurs.

When this shift phenomenon occurs after shipping, it is perceived in the form of reduced luminance or luminance irregularities, and it is therefore often effective to perform heat treatment prior to shipping in order to produce the shift beforehand.

As a different strategy against this shift phenomenon, the present inventors investigated improving the cohesion between the ITO film and the positive hole transport layer. A seventh mode of the invention was thus devised with the purpose of suppressing the shift phenomenon while achieving the objects of the invention stated above.

Specifically, according to a seventh mode of the invention, there is provided an organic EL element comprising an organic thin-films including a luminescent layer between a pair of electrodes, characterized in that one of the pair of electrodes is an ITO film composed of indium-tin oxide as a transparent electrode, with a crystalline organic metal complex film formed on the ITO film and one or more organic thin-films formed on the organic metal complex film, and in that all of the organic materials composing the organic thin-films are volatile during formation of the film by vacuum vapor deposition.

Like the sixth mode of the invention, since all of the organic materials composing the organic thin-films are evaporating materials, it is possible to adequately prevent current leaks and shorts.

When an organic metal complex film is formed on the ITO film and an organic thin-film is formed thereover, the organic thin-film on the ITO film side is the positive hole transport layer. Thus, the organic metal complex film becomes sandwiched between the ITO film and the positive hole transport layer.

When an organic metal complex film is formed on the ITO film, the film is epitaxially formed by vacuum vapor deposition or the like, and therefore high cohesion is achieved with the ITO film. Also, the organic metal complex film has high crystallinity or molecular polarity, such that the cohesion is also high with the molecular polar positive hole transport material.

Thus, sandwiching of an organic metal complex film between the ITO film and positive hole transport layer is highly effective for improving the cohesion between the ITO film and the positive hole transport layer. It is thereby possible to inhibit peeling between the ITO film and the positive hole transport layer by heating, and thus maintain charge injection properties between the two layers.

According to the invention, therefore, it is possible to adequately prevent current shorts and leaks while inhibiting shift of the V-I characteristic of the element toward the high voltage end in high-temperature environments.

The organic metal complex film preferably undergoes minimal change in crystallinity in high-temperature environments. This will make it possible to reduce irregularities produced in the organic metal complex film by changes in crystallinity in high-temperature environments, thereby greatly minimizing changes in the positive hole injection property from the ITO film into the positive hole transport layer through the organic metal complex film.

From this viewpoint, further experimental investigation was conducted toward minimizing change in the positive hole injection property from the ITO film into the positive hole transport layer through the organic metal complex film and reducing to a minimum the shift in the V-I characteristic of the element toward the high voltage end in high-temperature environments, in order to determine the preferred degree of change in crystallinity of the organic metal complex film.

The eight mode of the invention was accomplished based on the aforementioned sixth and seventh modes, and also based on the results of investigating change in crystallinity of the organic metal complex film and, like the first aspect of the invention, it is characterized in that among the values of the diffraction peaks appearing with X-ray diffraction of the organic metal complex film, the change in the diffraction peak value produced by heating in the utilization temperature range of the organic EL element is within ±25% of the diffraction peak value before heating.

If, among the values of the diffraction peaks appearing with X-ray diffraction of the crystalline organic metal complex film, the change in the diffraction peak value produced by heating in the utilization temperature range of the organic EL element is within ±25% of the diffraction peak value before heating, it is possible to limit to a higher degree the shift in the V-I characteristic of the element toward the high-voltage end in high-temperature environments, in addition to the effect of the seventh mode of the invention.

Copper phthalocyanine may be used as the organic complex film.

The effect of the organic EL element described above can be adequately exhibited even when applied for exposure to high-temperature environments of 70° C. and above.

BRIEF DESCRIPTION OF THE DRAWINGS

FIGS. 1A and 1B are illustrations showing the assumed structure of the amorphous state and the assumed structure of the crystalline state of a conventional organic material.

FIG. 2 is a graph showing the shift in V-I characteristic before and after high-temperature standing at 100° C., 12 hr, for the trial product obtained by the present inventors.

FIGS. 5A to 5C are schematic cross-sectional views of the above-mentioned trial product, based on results of observing the organic thin-film composed of Alq3 as a sublimating material.

FIG. 14 is a table showing the data for FIG. 13.

DETAILED DESCRIPTION OF THE INVENTION

Figure 9:
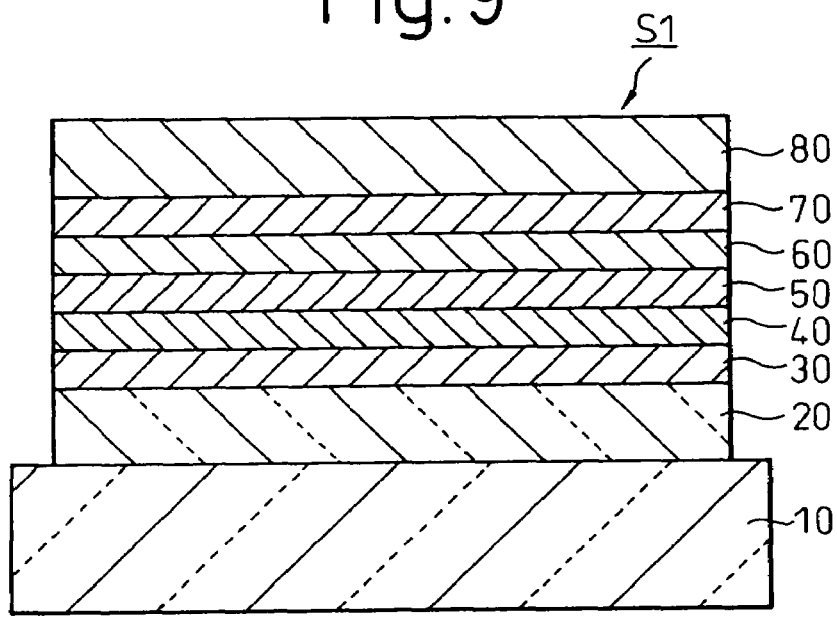
FIG. 9 is a schematic cross-sectional view of an organic EL element according to an mode of the invention.

The present invention will now be explained with reference to the attached drawings. FIG. 9 is a schematic view of the cross-sectional structure of an organic EL element S1 according to the first aspect of the invention.

An anode 20 composed of indium-tin oxide (hereinafter referred to as ITO) is formed on a substrate 10 composed of transparent glass. On the anode 20 there is formed a positive hole injection layer 30 composed of CuPc (copper phthalocyanine) as the crystalline organic material, and on the positive hole injection layer 30 there is formed a positive hole transport layer 40 composed of a triphenylamine tetramer.

On the positive hole transport layer 40 there is formed a luminescent layer 50 composed of dimethylquinacridone-added Alq3, and on the luminescent layer 50 there is formed an electron transport layer 60 composed of Alq3 (8-hydroxyquinoline-aluminum complex). On the electron transport layer 60 there is further formed an electron injection layer 70 composed of LiF and thereover a cathode 80 composed of Al.

Thus, there are laminated between the pair of electrodes 20 and 80, the positive hole injection layer 30 composed of a crystalline organic material, and the layers composed of amorphous organic materials, i.e., the positive hole transport layer 40, the luminescent layer 50, the electron transport layer 60 and the electron injection layer 70, to form an organic EL element S1.

In this organic EL element S1, an electric field is applied between the anode 20 and the cathode 80, such that positive holes are injected and transported from the anode 20 and electrons from the cathode 80 into the luminescent layer 50, with rebonding of the electrons and positive holes occurring in the luminescent layer 50 so that the luminescent layer 50 emits light by the bonding energy. The light emission is visible from the substrate 10 side, for example.

The organic EL element S1 of the invention is employed for a vehicle display or the like, and may be used at a temperature of about −40° C. to 120° C.

When the positive hole injection layer 30 composed of CuPc, i.e. the CuPc film 30, as the crystalline organic material was measured by X-ray diffraction, the diffraction peak of the (200) plane of the CuPc film 30 parallel to the substrate 10 is the diffraction peak indicating the crystallinity of the CuPc film 30. This diffraction peak corresponds to the peak generated at $2\theta=6.68°$ shown in FIG. 3, and will hereinafter be referred to as the CuPc crystallinity peak.

According to this embodiment, the change in the CuPc crystallinity peak value, or the peak integral value, due to heat in the range of utilization temperature of the organic EL element S1 (for example, −40° C. to 120° C.), from the CuPc crystallinity peak value ($2\theta=6.68°$) is within ±25% of the CuPc crystallinity peak value before heating.

(First Mode)

By minimizing the change in the CuPc crystallinity peak value between before and after heating to within ±25%, it is possible to limit the change in the crystalline state of the organic material to a level which does not result in luminance reduction or luminance irregularities, or shorts and leaks, even with use in high-temperature environments. It is preferably kept to within ±15% more preferably within ±10% of the peak value.

Thus, according to the organic EL element S1 of this embodiment, it is possible to prevent current leaks and shorts and thus realize satisfactory luminance properties, in the range of utilization temperature.

Figure 3:
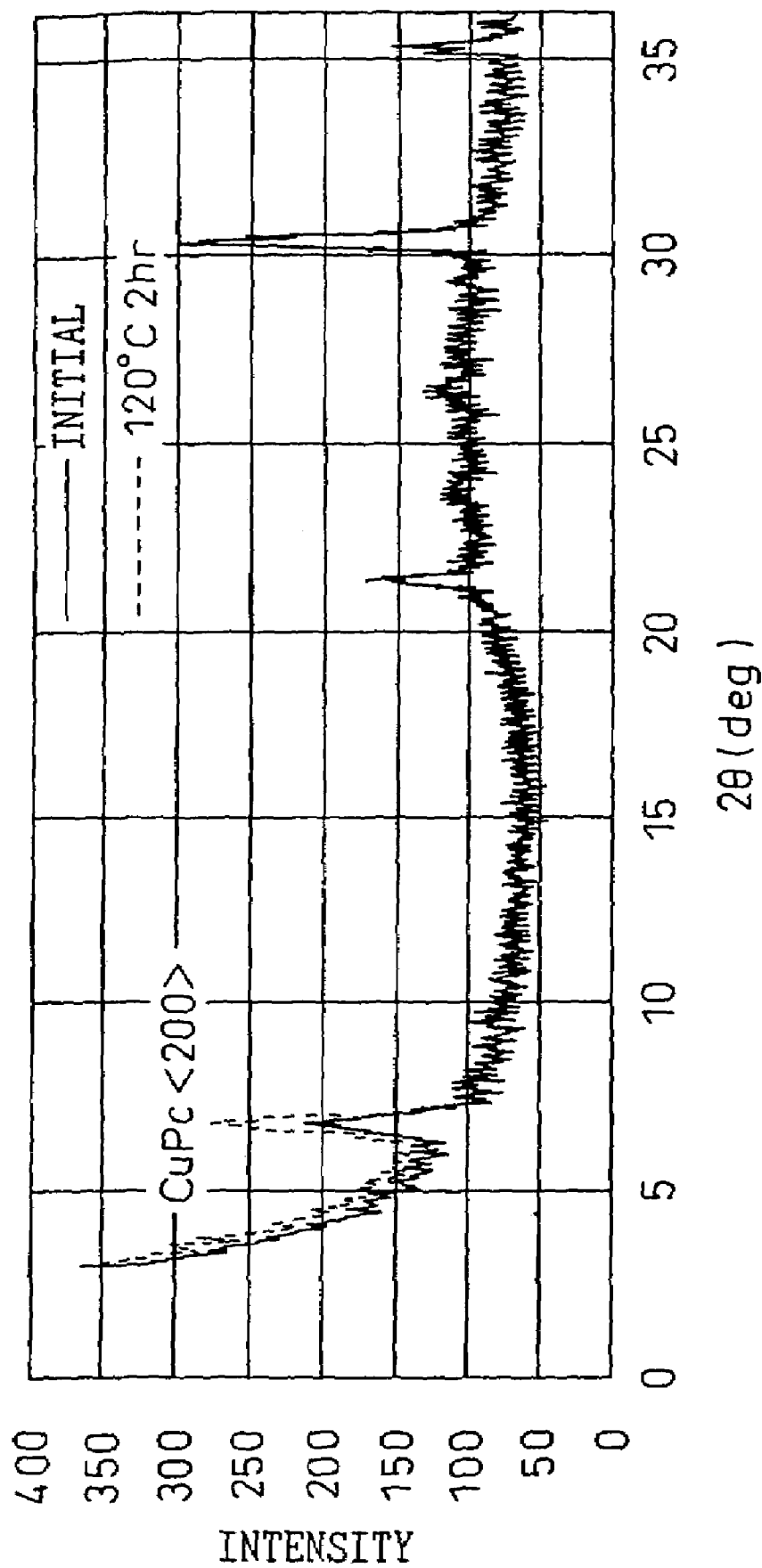
FIG. 3 is a graph showing the X-ray diffraction spectrum of a CuPc film before and after high-temperature standing at 100° C., 12 hr, for the trial product obtained by the present inventors.
Figure 4:
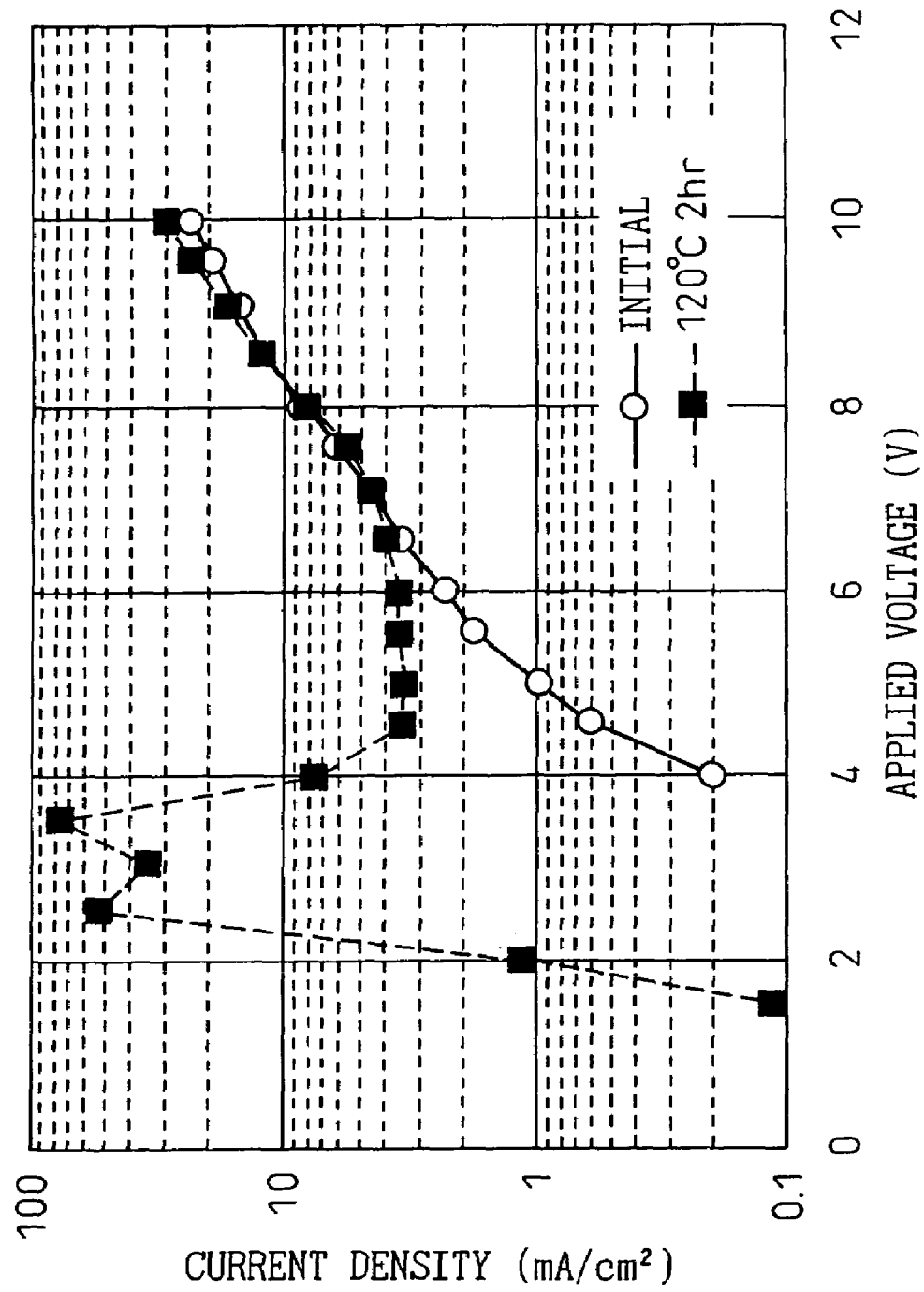
FIG. 4 is graph showing V-I characteristics before and after high-temperature standing at 100° C., 12 hr, for the trial product obtained by the present inventors.
Figure 6:
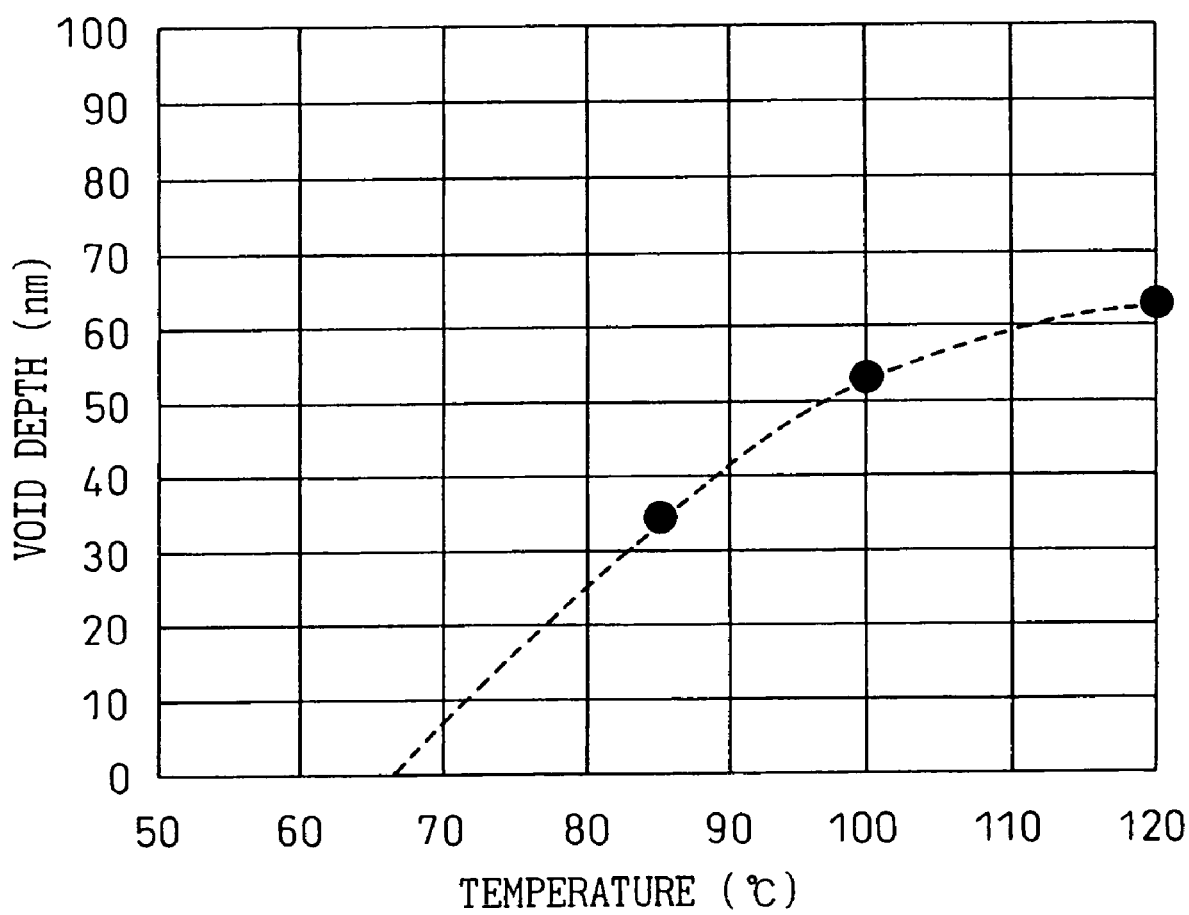
FIG. 6 is a graph showing the temperature dependency of the depth of the voids shown in FIG. 5C.
Figure 7:
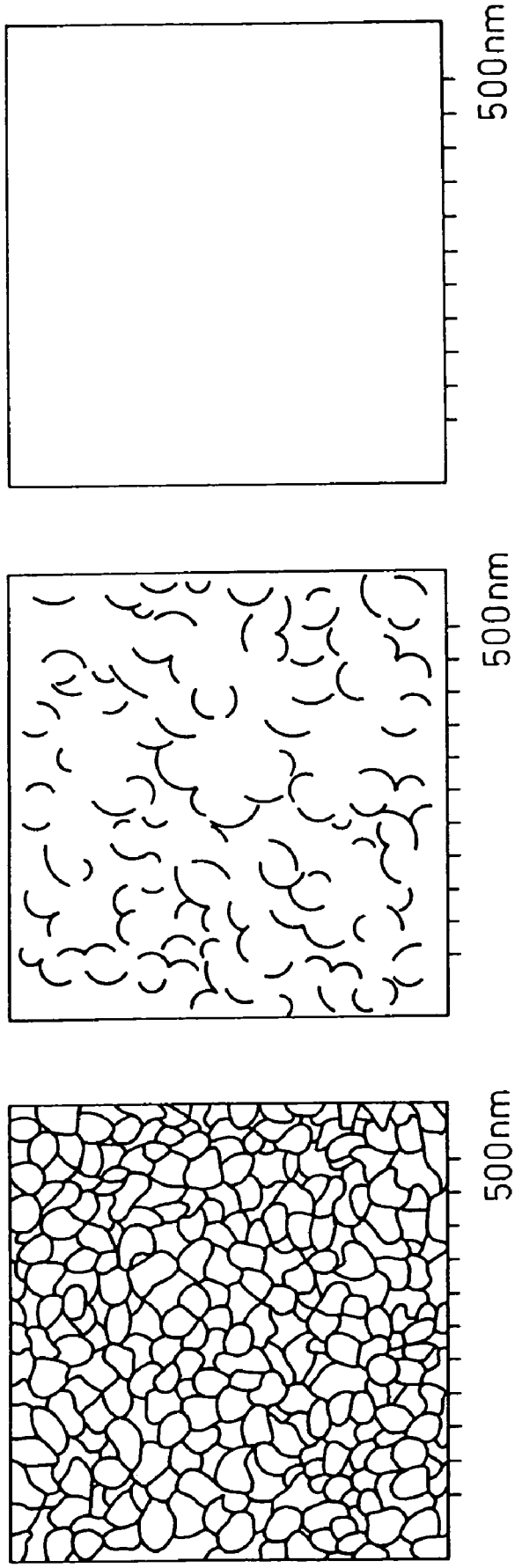
FIGS. 7A to 7C are illustrations based on the result of microscope observation of the surface of a CuPc film on ITO film, the surface of a luminescent layer composed of a sublimating material and the surface of a luminescent layer composed of a evaporating material.

Incidentally, as mentioned above, an organic EL element with a conventional crystalline organic material exhibited a significant change in the CuPc crystallinity peak value after heating of 1.5 times the CuPc crystallinity peak value before heating, as shown in FIG. 3, and thus produces shorts and leaks, while exhibiting reduced luminance or luminance irregularities due to a major shift in the V-I characteristic, as shown in FIG. 2.

A specific example of a manufacturing process for an organic EL element S1 according to this embodiment will now be explained in a non-limitative manner.

[First Manufacturing Process] (Third Mode)

On a glass substrate 10 there is formed an ITO film 20 by sputtering or the like, as an anode, and the surface of the ITO film 20 is exposed to ultraviolet irradiation while heating to 300° C. This treatment of the ITO film 20 will be referred to as UV-300° C. treatment.

After the UV-300° C. treatment, a CuPc film 30 is formed to a thickness of 10 nm as a positive hole injection layer by vapor deposition at a material heating temperature of 420° C. This is followed by successive formation of a positive hole transport layer 40 composed of a triphenylamine tetramer film, a luminescent layer 50 composed of Alq3 (host material)+dimethylquinacridone (guest material), an electron transport layer 60 composed of Alq3, an electron injection layer 70 composed of LiF and a cathode 80 composed of Al. This completes the organic EL element S1 shown in FIG. 9.

The CuPc film 30 formed on this UV-300° C. treated ITO film 20 was subjected to X-ray diffraction analysis before and after accelerated high-temperature standing (120° C., 2 hr).

As a result, the ratio of the CuPc crystallinity peak produced at $2\theta=6.68°$ after standing treatment compared to the value before standing treatment was confirmed to be a very small value of 1.02. That is, it is exhibits of that the crystalinity of the CuPc film 30 as film formed in accordance with the present invention is very high and stable.

A sealed element obtained by sealing the prepared organic EL element in a hermetic can was examined under accelerated high-temperature standing at 120° C., 2 hr, and this revealed virtually no shift in the V-I characteristic, or any luminance reduction or luminance irregularities. Also, no current shorts or leaks were produced.

That is, the organic EL element S1 produced by the first manufacturing process prevented from current shorts and leaks and exhibited satisfactory luminance properties in the range of utilization temperature.

This effect was due to the UV-300° C. treatment in the manufacturing process. The mechanism of the effect achieved by this treatment will now be explained in detail.

It is known that efficient injection of positive holes from the ITO film 20 as the anode into the CuPc film 30 as the positive hole injection layer requires cleaning treatment of the ITO film surface. However, evaluation is generally made based on the ionization potential (Ip) of the ITO film surface after cleaning, and the present inventors had judged that an Ip of 5.5 eV or lower of the ITO film 20 immediately after cleaning treatment of the ITO film 20 was satisfactory in light of the positive hole injection property.

However, according to investigation by the present inventors, the Ip after 5 minutes of plasma cleaning treatment with argon and oxygen (1:1 proportion) was 5.45 eV, the Ip after 20 minutes of UV treatment alone was 5.5 ev, and the Ip after 20 minutes of UV-300° C. treatment was 5.46 eV, and therefore no significant difference was found.

Nevertheless, only the element subjected to UV-300° C. treatment exhibited no V-I characteristic shift, i.e. no luminance reduction, luminance irregularities, shorts or leaks, after high-temperature standing. That is, the crystallinity of the crystalline organic material formed as a film on the ITO is not determined solely by the Ip, but is also dependent on other factors.

Since the heat treatment was implicated in the UV-300° C. treatment, the moisture on the ITO surface was examined by measuring the moisture release, or moisture desorption, from the surface of the ITO film 20 at various temperatures, according to the thermal desorption method (hereinafter referred to as "TDS method").

Figure 10:
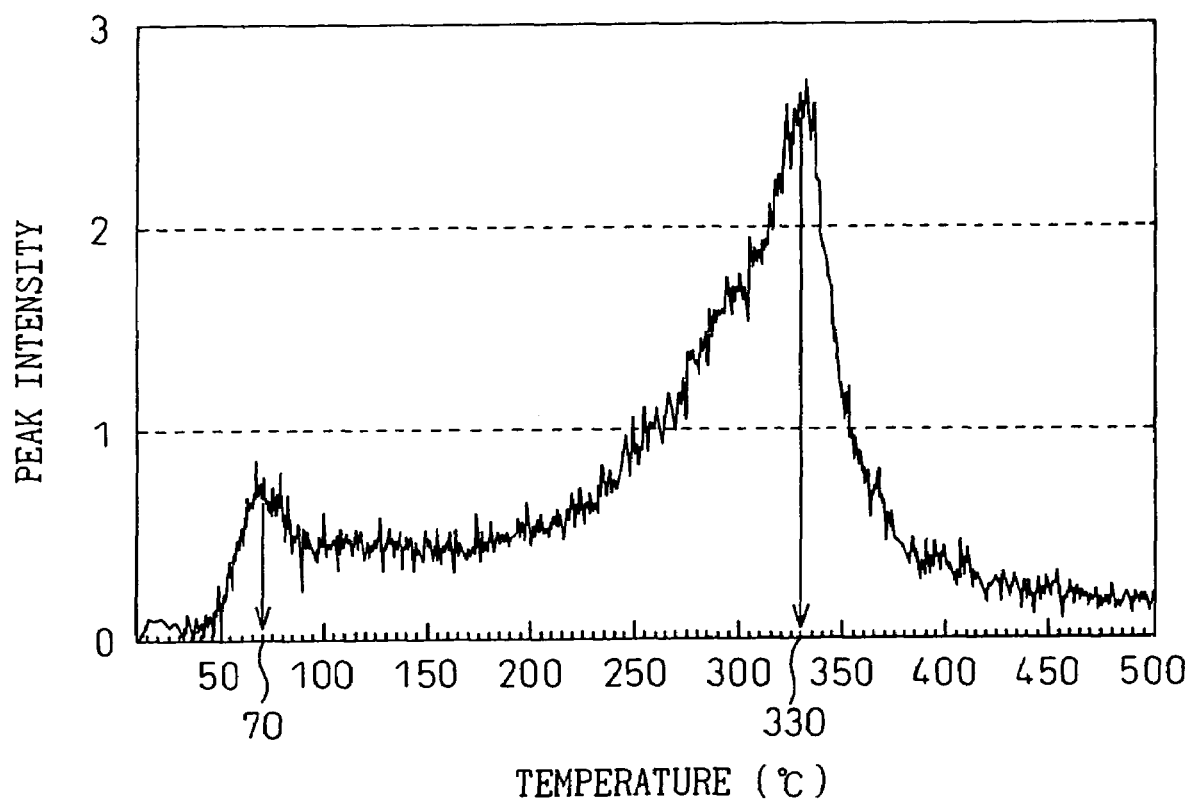
FIG. 10 is a graph showing the TDS spectrum directly after formation of an ITO film on a glass substrate.

FIG. 10 shows the measurement results by the TDS method immediately after forming the ITO film 20 on the glass substrate 10. The TDS spectrum was obtained by measuring the spectrum with a molecular weight, or M/z according to the TDS method, of 18 for $H_2O$ or 17 for OH.

The results shown in FIG. 10 show a moisture desorption peak at 70° C. and 330° C. The former peak is believed to be the portion of moisture present as adsorption water actually physically adhering to the surface of the ITO film 20, and the latter is believed to be the moisture present as bonded water chemically bonded to ITO on the surface of the ITO film 20. It was thus conjectured that the bonded water on the surface of the ITO film 20 might be one factor determining the crystallinity during formation of the CuPc film 30.

Figure 11:
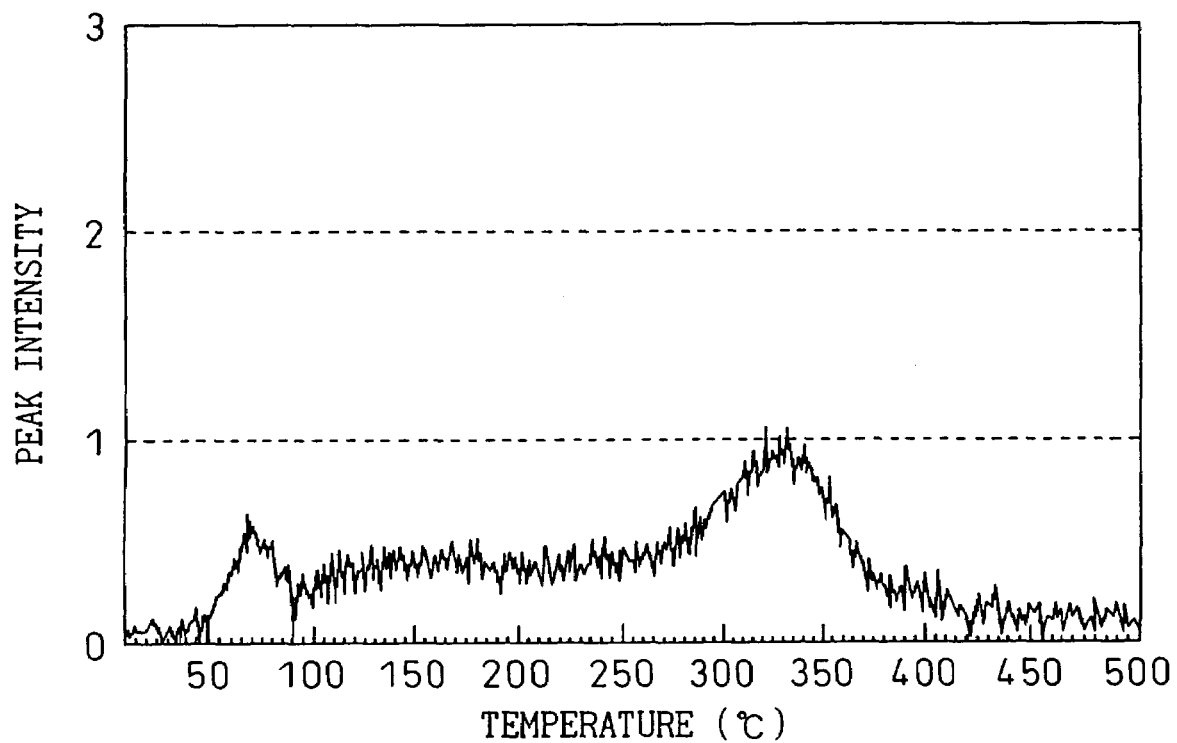
FIG. 11 is a graph showing the TDS spectrum of the surface of an ITO film upon heat treatment at a temperature of 300° C. in a nitrogen atmosphere.
Figure 12:
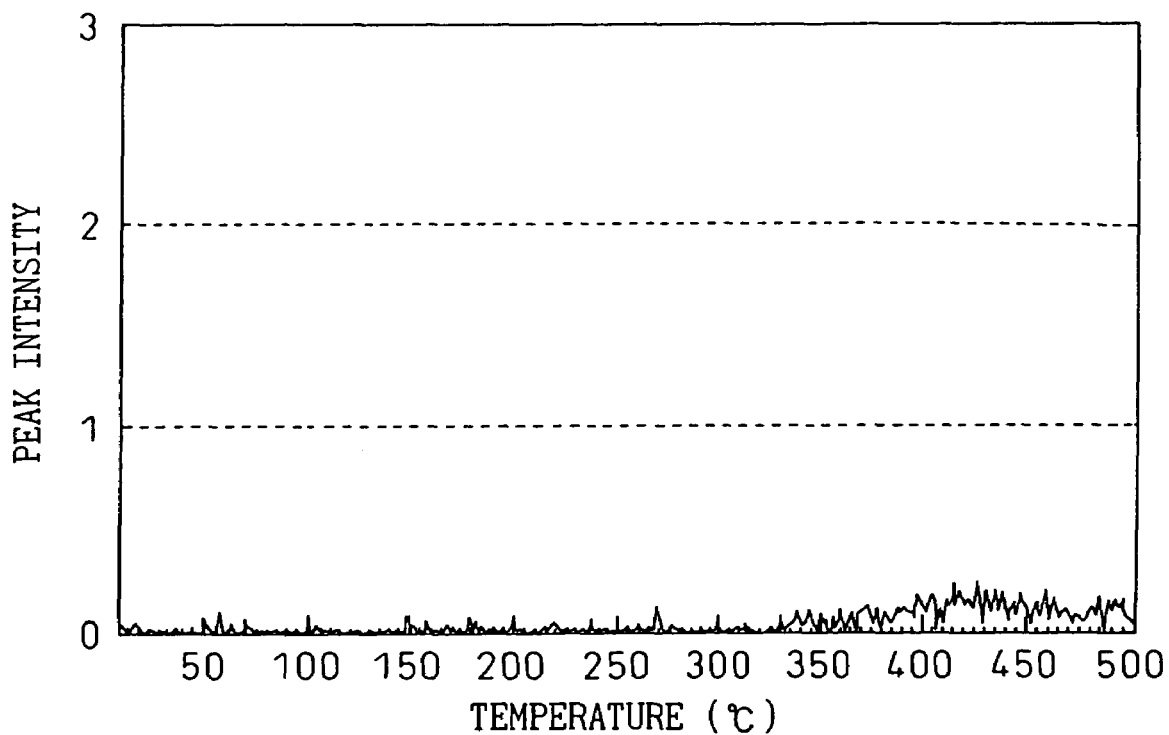
FIG. 12 is a graph showing the TDS spectrum of the surface of an ITO film upon heat treatment at a temperature of 300° C. in a vacuum.

FIG. 11 shows the TDS spectrum for an actual case with the ITO film 20 formed on the glass substrate 10, and heat treated at a temperature of 300° C. in a nitrogen atmosphere. The peak value at 330° C. is reduced by about 50% with respect to the TDS spectrum shown in FIG. 10 for a case without heat treatment. FIG. 12 shows the TDS spectrum for a case with heat treatment at 300° C. in a vacuum. In this case, almost no peak is discernible at 330° C.

These organic EL elements S1 prepared with heat treatment of an ITO film at 300° C. either in a nitrogen atmosphere or in a vacuum, sealed in hermetic cans as sealed elements, were examined under accelerated high-temperature standing conditions of 120° C., 2 hr, and as a result virtually no V-I characteristic shift or luminance reduction or irregularities were found. Also, no current shorts or leaks were produced.

This indicates that in a process for manufacture of an organic EL element comprising an ITO film 20 formed on a substrate 10 and a crystalline organic material, such as a CuPc film 30, formed on the ITO film 20, it is effective to subject the surface of the ITO film 20 to bonded water desorption treatment before forming the organic material film.

Since it is thereby possible to reduce bonding water as well as adsorption water on the surface of the ITO film 20 underlying the crystalline organic material, the crystallinity of the organic material film may be increased, to prevent current shorts and leaks and realize satisfactory luminance properties in the range of utilization temperature.

As shown in FIG. 11, the bonded water peak at near 330° C. in the TDS spectrum derived from moisture on the surface of the ITO film 20 after desorption treatment is preferably within 50% of the bonded water peak value of the ITO film 20 before desorption treatment.

Also, as shown in FIG. 12, it is more preferred for there to be no bonded water peak at near 330° C. in the TDS spectrum derived from moisture on the surface of the ITO film 20 after desorption treatment. (Second mode)

In order to reduce the bonded water on the surface of the ITO film 20 to within about 50%, the heat treatment temperature of the ITO film 20 is preferably 250° C. or higher before forming the crystalline organic material of the CuPc film 30 on the ITO film 20.

According to this mode, there is provided an organic EL element S1 having an ITO film 20 composed of indium-tin oxide formed on a substrate 10, with a crystalline organic material for a CuPc film 30 formed as a film on the ITO film 20, characterized in that the ITO film 20 has no bonded water peak at near 330° C. in the moisture-derived spectrum measured by the TDS method on the surface.

This makes it possible to prevent current shorts and leaks and realize satisfactory luminance properties in the range of utilization temperature.

[Second Manufacturing Process]

In the first manufacturing process described above, heat treatment of the ITO film 20 underlying the CuPc film 30 and others made of a crystalline organic material increases the crystallinity of the CuPc film 30.

The second manufacturing process focuses on the material temperature during formation of the CuPc film 30. On a glass substrate 10 there is formed an ITO film 20 by sputtering or the like, as an anode. The ITO deposited glass substrate is subjected to the argon/oxygen plasma cleaning treatment described above, and then a CuPc film 30 is formed on the ITO film 20 as a positive hole injection layer by vapor deposition, at a material heating temperature of 420° C. This will be referred to as the "420° C. deposited product".

Separately, a glass substrate with an ITO film is subjected to the argon/oxygen plasma cleaning treatment described above, and then a CuPc film 30 is formed on the ITO film 20 as a positive hole injection layer by vapor deposition, at a material heating temperature of 520° C. This will be referred to as the "520° C. deposited product".

Next, the 420° C. deposited product and the 520° C. deposited product are used to manufacture organic EL elements S1 by successively forming on each CuPc film 30 a positive hole transport layer 40, a luminescent layer 50, an electron transport layer 60, an electron injection layer 70 and a cathode 80, in the same manner as the first manufacturing process.

The ratio of the CuPc crystalline peak value of the 420° C. deposited product and the 520° C. deposited product before and after the aforementioned accelerated high-temperature standing (120° C., 2 hr) was determined by X-ray diffraction analysis. The V-I characteristic shift before and after the accelerated high-temperature standing was also examined after sealing in a hermetic can.

In the case of the 420° deposited product, the CuPc crystallinity peak ratio was approximately 1.5 (see FIG. 3) and the shift was approximately 3 V (see FIG. 2), whereas in the case of the 520° C. deposited product, the CuPc crystallinity peak ratio was approximately 1.15 and the shift was satisfactory, at approximately 1 V.

Another example of the second manufacturing process will now be illustrated. On a glass substrate 10 there is formed an ITO film 20 by sputtering or the like, as an anode. The surface of the ITO film 20 of the ITO deposited glass substrate is exposed to ultraviolet irradiation while heating at 150° C. (UV-150° C. treatment).

Next, a CuPc film 30 is formed on the ITO film 20 as a positive hole injection layer by vapor deposition, at a material heating temperature of 520° C. An organic EL element S1 is then manufactured by successively forming on the CuPc film 30 a positive hole transport layer 40, a luminescent layer 50, an electron transport layer 60, an electron injection layer 70 and a cathode 80, in the same manner as the first manufacturing process.

The organic EL element S1 obtained in this manner is sealed in a hermetic can to obtain a sealed element, and as a result of analyzing this after accelerated high-temperature standing at 120° C., 2 hr, the V-I characteristic shift was small and no luminance reduction or luminance irregularities were found. Also, no current shorts or leaks were produced. The V-I characteristic shift before and after accelerated high-temperature standing was 1.2 V, and the CuPc crystallinity peak ratio was 1.21.

As an additional example, the surface of the ITO film 20 of an ITO deposited glass substrate formed in the same manner as above was exposed to ultraviolet irradiation at ordinary temperature (UV-room temperature treatment). A CuPc film 30 was then formed as a positive hole injection layer on the ITO film 20 by vapor deposition with a material heating temperature of 520° C.

The organic EL element S1 obtained by successively forming the upper layers 40-80 in the same manner as above was sealed in a hermetic can to obtain a sealed element and subjected to conditions of accelerated high-temperature standing at 120° C., 2 hr.

As a result, the V-I characteristic shift was small and no luminance reduction or luminance irregularities were found. Also, no current shorts or leaks were produced. The V-I characteristic shift before and after accelerated high-temperature standing for this example was 1.5 V, and the CuPc crystallinity peak ratio was 1.21.

According to the second manufacturing process in which the depositing temperature for the CuPc film 30 is 520° C., there is obtained an organic EL element which satisfies the required properties regardless of the surface treatment method for the ITO film 20 and even without UV-300° C. treatment which was employed in the aforementioned first manufacturing process. This indicates that the ITO surface is not the only factor affecting the CuPc crystallinity, since it also depends on the depositing method.

In other words, an organic EL element S1 manufactured by the second manufacturing process also has very highly stable crystallinity of the CuPc film 30, and prevents current shorts or leaks and exhibits satisfactory luminance properties in the range of utilization temperature.

[Third Manufacturing Process] (Fifth Mode)

In this third manufacturing process, a CuPc film 30 as the crystalline organic material film is formed on an ITO film 20 and heat treated in a vacuum or in an inert gas atmosphere to complete formation of the CuPc film 30.

That is, an ITO film 20 is formed on a glass substrate 10, and then a CuPc film 30 is formed thereover by vapor deposition or the like, the CuPc film 30 is heat treated, and then a positive hole transport layer 40, a luminescent layer 50, an electron transport layer 60, an electron injection layer 70 and a cathode 80 are successively formed thereover to manufacture an organic EL element S1. A concrete example of the third manufacturing process carried out by the present inventors will now be explained.

(Concrete Example 1 of Third Manufacturing Process)

On a glass substrate 10 there was formed an ITO film 20 by sputtering, as an anode. The surface of the ITO film 20 of the ITO deposited glass substrate was subjected to argon/oxygen plasma cleaning treatment.

Next, a CuPc film 30 was formed as the positive hole injection layer on the ITO film 20 to a film thickness of 10 nm at a material heating temperature of 420° C. by vapor deposition. It was then heat treated for 20 minutes at a substrate temperature of 150° C. in a vacuum.

This was followed by successive formation of a positive hole transport layer 40 composed of a triphenylamine tetramer film, a luminescent layer 50 composed of Alq3 (host material)+dimethylquinacridone (guest material), an electron transport layer 60 composed of Alq3, an electron injection layer 70 composed of LiF and a cathode 80 composed of Al.

The organic EL element obtained in this manner was then sealed with a hermetic can to obtain a sealed element, and as a result of analyzing this under accelerated high-temperature standing conditions at 120° C., 2 hr, the V-I characteristic shift was small and no luminance reduction or luminance irregularities were found. Also, no current shorts or leaks were produced. The V-I characteristic shift before and after accelerated high-temperature standing was 1.0 V, and the CuPc crystallinity peak ratio was 1.13.

(Concrete Example 2 of Third Manufacturing Process)

In the same manner as Concrete example 1, an ITO film 20 was formed on a glass substrate 10 and subjected to argon/oxygen plasma cleaning treatment, after which a CuPc film 30 was formed to a film thickness of 10 nm at a material heating temperature of 420° C. by vapor deposition. For this example, it was then heat treated for 20 minutes at a substrate temperature of 100° C. in a vacuum.

Next, the upper layers 40-80 were successively formed in the same manner as above to obtain an organic EL element S1 which was then sealed in a hermetic can to obtain a sealed element and analyzed under accelerated high-temperature standing conditions at 120° C., 2 hr.

As a result, the V-I characteristic shift was small and no luminance reduction or luminance irregularities were found. Also, no current shorts or leaks were produced. In this example, the V-I characteristic shift before and after accelerated high-temperature standing was 1.0 V, and the CuPc crystallinity peak ratio was 1.15.

(Concrete Example 3 of Third Manufacturing Process)

In the same manner as Concrete example 1, an ITO film 20 was formed on a glass substrate 10 and subjected to argon/oxygen plasma cleaning treatment, after which a CuPc film 30 was formed to a film thickness of 10 nm at a material heating temperature of 420° C. by vapor deposition. For this example, it was then heat treated for 20 minutes at a substrate temperature of 70° C. in a vacuum.

Next, the upper layers 40-80 were successively formed in the same manner as above to obtain an organic EL element S1 which was then sealed in a hermetic can to obtain a sealed element and analyzed under accelerated high-temperature standing conditions at 120° C., 2 hr.

As a result, the V-I characteristic shift was small and no luminance reduction or luminance irregularities were found. Also, no current shorts or leaks were produced. In this example, the V-I characteristic shift before and after accelerated high-temperature standing was 1.6 V, and the CuPc crystallinity peak ratio was 1.25.

Thus, according to the third manufacturing process, formation of the CuPc film 30 as the crystalline organic material film on the ITO film 20 is followed by heat treatment in a vacuum or in an inert gas atmosphere, such that the crystallinity of the formed CuPc film 30 is increased by the heat treatment.

The reason for this is believed to be that the molecules in the CuPc film 30 vibrate due to the activation energy by heating, and move into a solid state with a more stable phase. This is closely correlated with temperature. Investigation by the present inventors has confirmed that subsequent heat treatment, rather than prior heat treatment, results in a larger crystallinity peak of the CuPc film 30 by X-ray diffraction, and thus improved crystallinity.

In Concrete examples 1 to 3 above, a CuPc film 30 heating temperature of 70° C. or above in the third manufacturing process can adequately increase the crystallinity of the CuPc film 30 and reduce the change in the crystallinity state of the CuPc film 30 to a level which produces no luminance reduction, luminance irregularities, shorts or leaks, even with use in high-temperature environments.

Thus, the third manufacturing process also can realize an organic EL element comprising a crystalline organic material, wherein current shorts or leaks are prevented and satisfactory luminance properties are exhibited in the range of utilization temperature. Incidentally, since the heat treatment is pointless if the heated film peels back off, the upper limit for the heat treatment temperature must naturally be no greater than the volatilization temperature or sublimation temperature of the film to be heated.

(Summary of Relationship Between Organic Material Layer Crystallinity and EL Properties)

Figure 13:
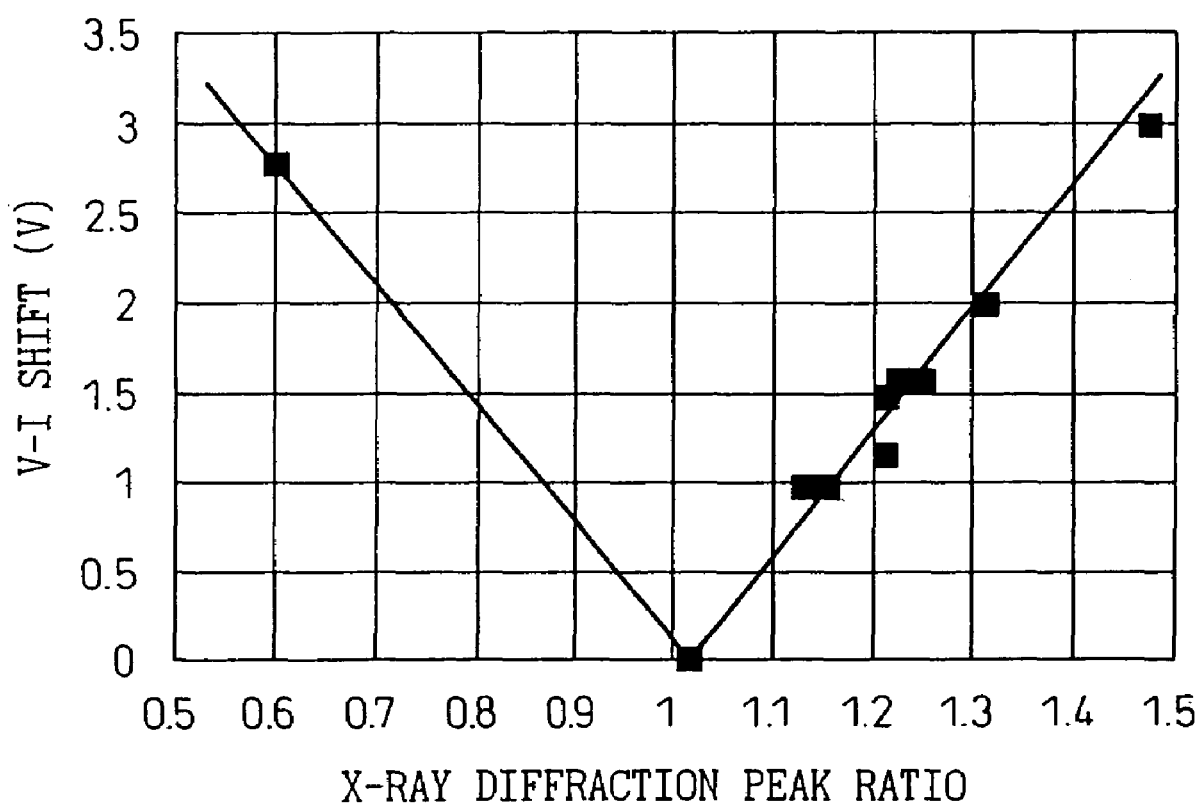
FIG. 13 is a graph showing the relationship between the CuPc crystalline peak ratio and the V-I characteristic shift before and after high-temperature standing at 120° C., 2 hr.

The relationship between the CuPc crystallinity peak ratio before and after accelerated high-temperature standing (120° C., 2 hr) and the degree of V-I characteristic shift will now be summarized. This relationship is shown in the graph in FIG. 13, the data for which are shown in FIG. 14. In FIGS. 13 and 14, the CuPc crystallinity peak ratio is indicated by "X-ray diffraction peak ratio", and the V-I characteristic shift is indicated by "V-I shift".

As mentioned above, the CuPc crystallinity peak ratio is the ratio of the CuPc crystallinity peak integral value after accelerated high-temperature standing with respect to the CuPc crystallinity peak integral value before accelerated high-temperature standing, with a ratio of greater than 1 indicating higher crystallinity of the CuPc film by accelerated high-temperature standing, and a ratio of less than 1 indicating lower crystallinity.

The V-I characteristic shift is the degree of shift, in volts, of the V-I characteristic after accelerated high-temperature standing based on the V-I characteristic before accelerated high-temperature standing. Specifically, since the CuPc crystallinity peak ratio showed a major increase in crystallinity of 1.5 in FIG. 3, the V-I characteristic shift was large at about 3 V as shown in FIG. 2.

In FIG. 14, the "Conditions before cleaning" is the conditions for cleaning of the ITO film 20 formed on the glass substrate 10, before forming the CuPc film 30, "Plasma" is the argon/oxygen plasma cleaning treatment, "UV300° C." and "UV250° C.", "UV150° C." and "UV room temperature" respectively indicate treatment carried out with ultraviolet irradiation at those temperatures. Also, "CuPc layer heating temperature" in FIG. 14 is the material temperature during formation of the CuPc film.

"Deposition method" in FIG. 14 indicates the conditions employed when conducting the third manufacturing method. "Heating after deposition (150° C. vacuum)", "Heating after deposition (100° C. vacuum) and "Post-film heating (70° C. vacuum)" each indicate Concrete example 1, Concrete example 2 and Concrete example 3 of the third manufacturing method.

The symbols "⊚", "○" and "×" represent "very excellent", "excellent" and "bad", respectively.

No obvious luminance irregularities could be found in the organic EL element with an X-ray diffraction peak ratio of 1.25 and a V-I shift of 1.6 V, shown in the graph in FIG. 13. However, obvious luminance irregularities were found in the organic EL element with an X-ray diffraction peak ratio of about 1.3 and a V-I characteristic shift of about 2.0 V.

This suggests that, when considering product quality, the threshold value for the X-ray diffraction peak ratio is approximately 1.25 and the threshold value for the V-I shift is approximately 1.6 V.

In other words, as explained above, if the degree of change in the CuPc crystallinity peak value due to heating within the range of utilization temperature of the organic EL element S1 (for example, −40° C. to 120° C.) is kept to within ±25% of the CuPc crystallinity peak before heating, then it is possible to prevent current shorts and leaks and realize satisfactory luminance properties of a practical level in the range of utilization temperature. (First mode)

FIG. 14 shows that if the heat treatment temperature for the ITO film 20 is 250° C. or higher, it is possible to effectively reduce both adsorption and bonded water on the surface of the underlying ITO film, to allow formation of an organic material film with increased crystallinity to achieve the effect described above.

(Fourth Mode).

Furthermore, the change in the CuPc crystallinity peak value by heating may be in a decreasing instead of an increasing direction. That is, the change may be no more than +25% or no less than −25% with respect to the CuPc crystallinity peak before heating, and as shown in FIG. 13, the X-ray diffraction peak ratio may even be 0.75 or greater. For example, luminance irregularities were observed with a V-I shift of 2.8 V, resulting when the X-ray diffraction peak ratio was 0.68.

The construction and manufacturing method suitable for the CuPc film, i.e. the positive hole injection layer 30, may also be suitably applied for the positive hole transport layer 40, luminescent layer 50, electron transport layer 60 and electron injection layer 70, when the organic materials composing them are also crystalline.

Figure 15:
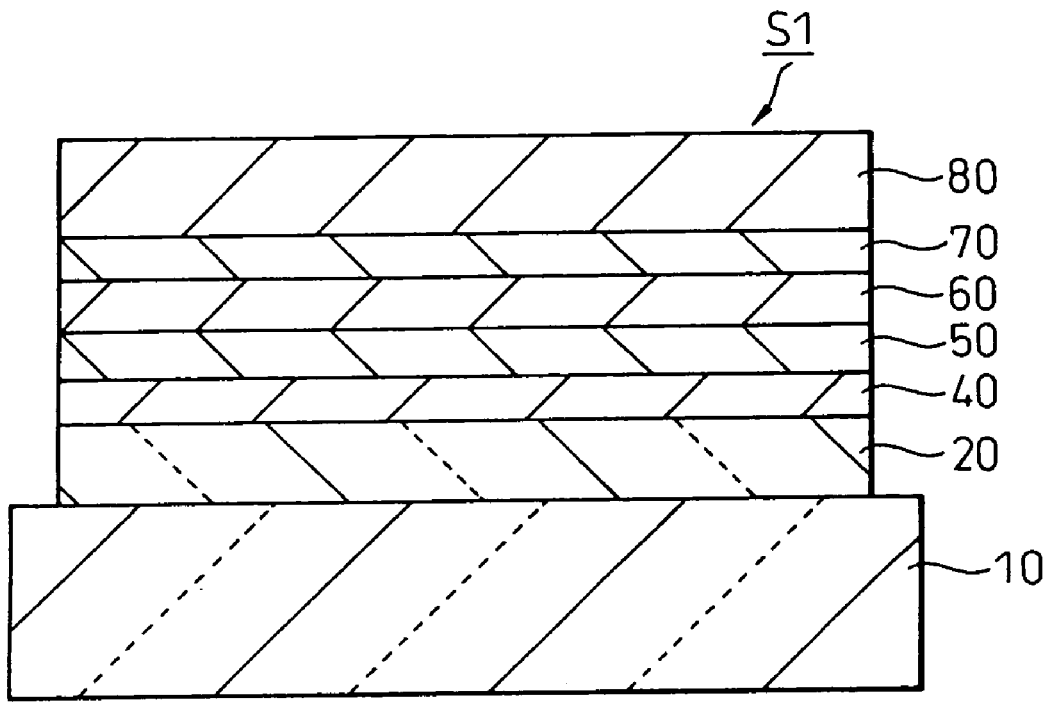
FIG. 15 is a schematic cross-sectional view of an organic EL element according to the sixth embodiment of the invention.

Embodiments of the second aspect of the invention illustrated in the drawings will now be explained. FIG. 15 shows the schematic cross-sectional construction of an organic EL element S1 according to the second aspect of the invention.

An anode 20 composed of indium-tin oxide (hereinafter, "ITO") is formed on a substrate 10 made of transparent glass. A positive hole transport layer 40 composed of triphenylamine tetramer is formed on the anode 20.

On the positive hole transport layer 40 there is formed a luminescent layer 50 composed of the above-mentioned dimethylquinacridone-added adamantane derivative, and on the luminescent layer 50 there is formed an electron transport layer 60 composed of the adamantane derivative. On the electron transport layer 60 there is further formed an electron injection layer 70 composed of LiF, over which there is formed a cathode 80 composed of Al.

In this organic EL element S1, an electric field is applied between the anode 20 and the cathode 80, such that positive holes are injected and transported from the anode 20 and electrons from the cathode 80 into the luminescent layer 50, with rebonding of the electrons and positive holes occurring in the luminescent layer 50 so that the luminescent layer 50 emits light by the bonding energy. The light emission is visible from the substrate 10 side, for example.

The organic EL element S1 according to this embodiment is employed for a vehicle display or the like, and may be used at a temperature of about −40° C. to 120° C.

In this organic EL element S1, all of the organic materials composing the organic thin-films 40-60 formed between the pair of electrodes 20,80 are evaporating materials, i.e. materials with volatility during film formation by vacuum vapor deposition.

Since all of the organic materials composing the organic thin-films in this organic EL element S1 are evaporating materials with volatility during film formation by vacuum vapor deposition, it is possible to prevent the problem of voids produced in high-temperature environments in conventional EL elements employing sublimating materials, as described above, to thereby adequately prevent generation of current leaks or shorts.

The manufacturing method for this organic-EL element S1 will now be explained. On a glass substrate 10 there is formed an ITO film 20 by sputtering or the like, as an anode, and the surface of the ITO film 20 is treated by an argon/oxygen mixed plasma, after which a triphenylamine tetramer film is formed to a thickness of 40 nm thereover as a positive hole transport layer 40, by vacuum vapor deposition.

Next, a luminescent layer 50 comprising dimethylquinacridone added at 1% to the above-mentioned adamantane derivative is formed to a thickness of 20 nm by vacuum vapor deposition. On this there are formed an electron transport layer 60 composed of the adamantane derivative and an electron injection layer 70 composed of LiF by vacuum vapor deposition, and then a cathode 80 film composed of Al is formed. This completes the organic EL element S1 shown in FIG. 15. The organic EL element S1 is then sealed in a hermetic can (not shown).

A completed organic EL element S1 was subjected to accelerated high-temperature standing, i.e. allowed to stand for 2 hours at a temperature of 120° C., voids were prevented in the organic thin-films 40-60, and current leaks and shorts were adequately prevented in the element S1.

Figure 8:
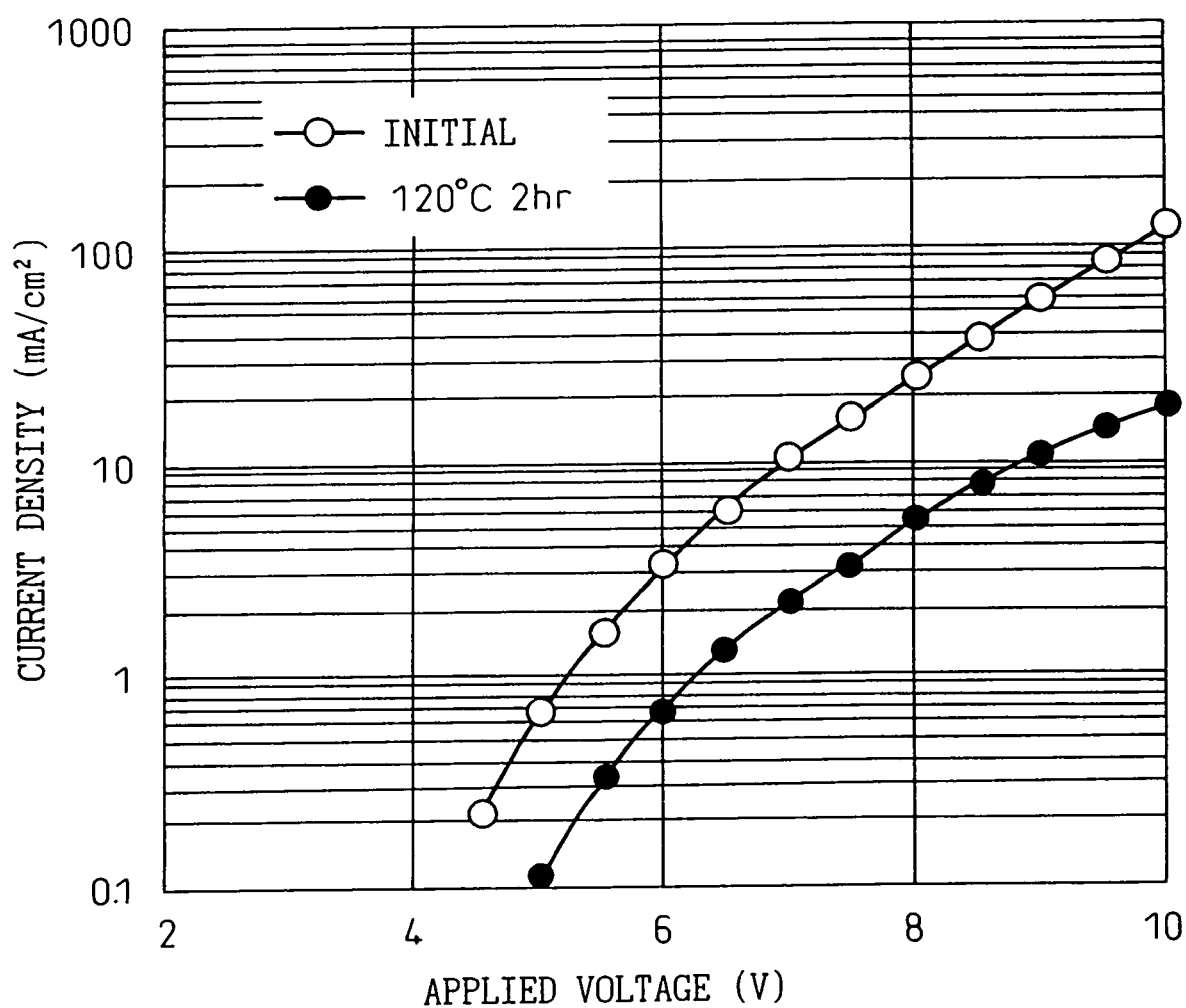
FIG. 8 is a graph showing the shift phenomenon of the voltage-current characteristic in a high-temperature environment for an organic EL element according to sixth mode of the invention.

When the organic EL element S1 of this embodiment was examined, it was found to exhibit the phenomenon whereby the voltage-current characteristic (V-I characteristic) of the element S1 shifted toward the high voltage end by the accelerated high-temperature standing, as shown in FIG. 8. In FIG. 8, a high voltage end shift of about 2 V is shown.

Figure 16:
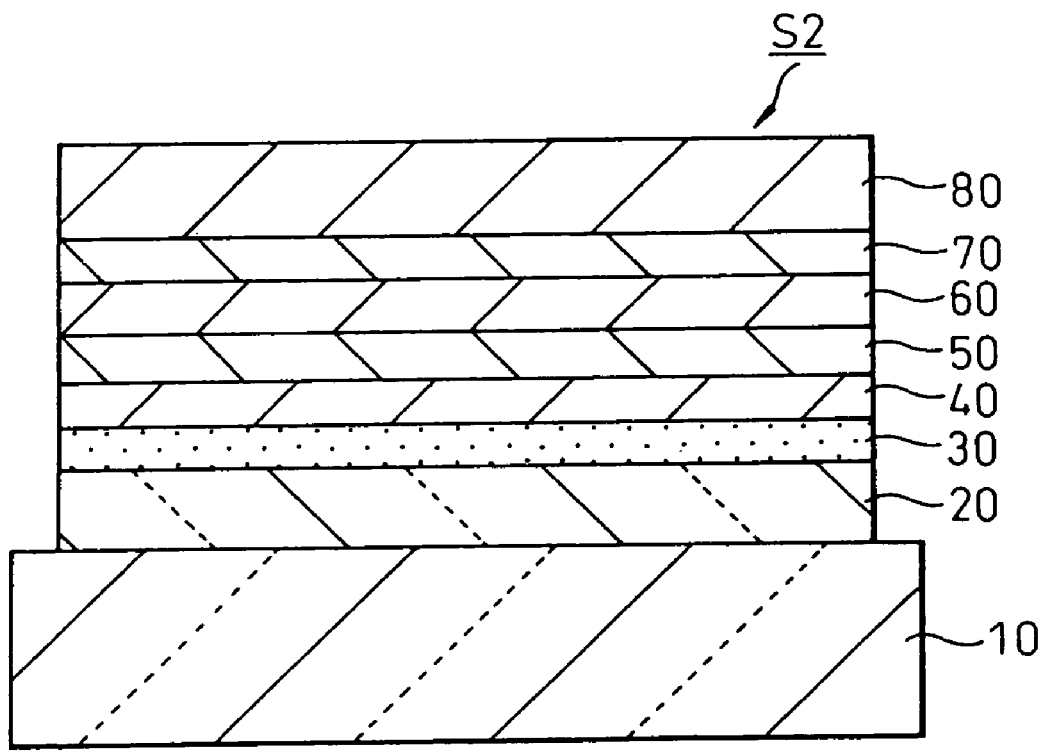
FIG. 16 is a schematic cross-sectional view of an organic EL element according to the seventh embodiment of the invention, which solves the voltage-current characteristic shift phenomenon shown in FIG. 13.

As a solution to this shift phenomenon, FIG. 16 shows a schematic cross-sectional structure of an organic EL element S2 according to another embodiment of the invention. In FIG. 16, the organic EL element S1 shown in FIG. 15 has a CuPc (copper phthalocyanine) film 30 as a crystalline organic metal complex film, sandwiched between the ITO film 20 as the anode and the positive hole transport layer 40. The CuPc film 30 functions as the positive hole injection layer.

Similar to the element S1 shown in FIG. 15, in this method an ITO film 20 is formed on a substrate 10 and the ITO film 20 is surface treated with argon/oxygen mixed plasma, after which a CuPc film 30 is formed to a thickness of 50 nm as a positive hole injection layer by vacuum vapor deposition, and there are successively formed a positive hole transport layer 40, a luminescent layer 50, an electron transport layer 60, an electron injection layer 70 and a cathode 8, in the same manner as above.

When the organic EL element S2 according to this embodiment was subjected to the above-mentioned accelerated high-temperature standing, voids were prevented in the organic thin-films 40-60 as with the organic EL element S1 shown in FIG. 15, and no current leaks and shorts occurred in the element S2. In addition, shift of the V-I characteristic toward the high voltage end with the organic EL element S2 of this embodiment was drastically reduced even with accelerated high-temperature standing.

[Examining X-Ray Diffraction Peaks of Organic Metal Complex Film]

In a preferred mode of the organic EL element S2 of this embodiment shown in FIG. 16, the change in the diffraction peak value of the CuPc film 30, as the organic metal complex film, by X-ray diffraction by heating in the range of utilization temperature of the organic EL element S2 (for example, −40° C. to 120° C.) is preferably within ±25% of the diffraction peak value before heating.

If the degree of change in the diffraction peak value of the CuPc film 20, as the crystalline organic metal complex film, by X-ray diffraction due to heating in the range of utilization temperature of the organic EL element S2 is kept to within ±25% of the diffraction peak value before heating, then it is possible to inhibit to a higher degree the shift in the V-I characteristic of the element toward the high voltage end in high-temperature environments, in addition to the effect of the aforementioned embodiment.

Since the support for the preferred mode of the organic EL element S2 according to this embodiment is the same as explained for the first aspect of the invention, a detailed description thereof is not considered necessary.

What is claimed is:

1. A process for manufacturing an organic electroluminescent element which comprises steps of:
   providing a substrate,
   depositing an ITO layer composed of indium-tin oxide on said substrate,
   heat treating a surface of said ITO layer and desorbing bonded water from the surface of said ITO layer, and
   depositing a crystalline organic material layer on said ITO layer after the heat treating and desorbing step.

2. A process for manufacturing an organic electroluminescent element according to claim 1, which is carried out so that in the moisture-derived spectrum of said ITO layer surface after the heat treating and desorbing step, as measured by thermal desorption, the bonded water peak value at near 330° C. is within 50% of said bonded water peak value of said ITO layer surface before the heat treating and desorbing step.

3. A process for manufacturing an organic electroluminescent element according to claim 1, which is carried out so that in the moisture-derived spectrum of said ITO layer surface after the heat treating and desorbing step, as measured by thermal desorption method, the bonded water peak value at near 330° C. disappears.

4. A process for manufacturing an organic electroluminescent element according to claim 1, wherein said crystalline organic material layer is formed on said ITO layer in contact with said ITO layer.

5. A process for manufacturing an organic electroluminescent element according to claim 1, wherein said crystalline organic material layer is a copper phthalocyanine layer.

6. A process for manufacturing an organic electroluminescent element, which comprises the steps of:
   providing a substrate,
   depositing an ITO layer composed of indium-tin oxide on said substrate,
   heating said ITO layer at a temperature of 250° C. or higher, and
   depositing a crystalline organic material layer on said ITO layer after the heating step.

7. A process for manufacturing an organic electroluminescent element according to claim 6, wherein said crystalline organic material layer is formed on said ITO layer in contact with said ITO layer.

8. A process for manufacturing an organic electroluminescent element according to claim 6, wherein said crystalline organic material layer is a copper phthalocyanine layer.

9. A process for manufacturing an organic electroluminescent element, which comprises the steps of:
   providing a substrate,
   depositing an ITO layer composed of indium-tin oxide on said substrate, and
   depositing a crystalline organic material layer on said ITO layer, and then heating said crystalline organic material layer in a vacuum or in an inert gas atmosphere to complete formation of said crystalline organic material layer.

10. A process for manufacturing an organic electroluminescent element according to claim 9, wherein the heating step is carried out at a temperature is of 70° C. or higher.

11. A process for manufacturing an organic electroluminescent element according to claim 9, wherein said crystalline organic material layer is formed on said ITO layer in contact with said ITO layer.

12. A process for manufacturing an organic electroluminescent element according to claim 9, wherein said crystalline organic material layer is a copper phthalocyanine layer.

13. A process for manufacturing an organic electroluminescent element comprising an ITO layer on a glass substrate, the ITO layer being composed of indium-tin oxide, and a copper phthalocyanine layer on said ITO layer,
   wherein after said ITO layer is formed, said ITO layer is heated at 250° C. or more while ultraviolet rays are irradiated onto said ITO layer, and then said copper phthalocyanine layer is formed.

14. The process according to claim 13, wherein said heat treatment is conducted at 300° C.

15. A process for manufacturing an organic electroluminescent element comprising an ITO layer on a glass substrate, the ITO layer being composed of indium-tin oxide, and a copper phthalocyanine layer on said ITO layer, wherein after said ITO layer is formed, said ITO layer is heated at 250° C. or more under a vacuum while ultraviolet rays are irradiated onto said ITO layer, and then said copper phthalocyanine layer is formed.

16. The process according to claim 15, wherein said heat treatment is conducted at 300° C.

17. A process for manufacturing an organic electroluminescent element, which comprises steps of:
    providing a substrate,
    depositing a first electrode of an ITO layer on said substrate, the ITO layer being composed of indium-tin oxide on said substrate,
    depositing a crystalline organic electroluminescent material layer of a copper phthalocyanine layer directly on said first electrode, and
    depositing a second electrode on said crystalline organic electroluminescent material layer,
    wherein said copper phthalocyanine layer of said crystalline organic electroluminescent material layer has a physical property that when said copper phthalocyanine layer is heated in a range of temperature at which said organic electroluminescent element is used, the change in the property of said copper phthalocyanine layer before and after said heating is within a predetermined range in that the change in the X-ray diffraction peak value of the (200) plane of said copper phthalocyanine layer parallel to said substrate is within ±25% with respect to said diffraction peak value before said heating.

18. The process according to claim 17, wherein said ITO layer has no bonded water on the surface thereof, having no peak bonded water at near 330° C. in the moisture-derived spectrum of the surface as measured by thermal desorption method.

* * * * *